(12) United States Patent
Shen et al.

(10) Patent No.: US 10,718,187 B2
(45) Date of Patent: Jul. 21, 2020

(54) METHODS FOR ANALYZING AND OPTIMIZING DRILLING TOOL ASSEMBLIES

(71) Applicant: Smith International, Inc., Houston, TX (US)

(72) Inventors: Yuelin Shen, Spring, TX (US); Wei Chen, Spring, TX (US); Zhengxin Zhang, Spring, TX (US); Jibin Shi, Spring, TX (US); Riadh Boualleg, Cambridge (GB); Sujian Huang, Beijing (CN)

(73) Assignee: SMITH INTERNATIONAL, INC., Houston, TX (US)

(*) Notice: Subject to any disclaimer, the term of this patent is extended or adjusted under 35 U.S.C. 154(b) by 96 days.

(21) Appl. No.: 15/319,844

(22) PCT Filed: Jun. 23, 2015

(86) PCT No.: PCT/US2015/037083
§ 371 (c)(1),
(2) Date: Dec. 19, 2016

(87) PCT Pub. No.: WO2015/200259
PCT Pub. Date: Dec. 30, 2015

(65) Prior Publication Data
US 2017/0138157 A1 May 18, 2017

Related U.S. Application Data

(60) Provisional application No. 62/015,881, filed on Jun. 23, 2014.

(51) Int. Cl.
*G06G 7/48* (2006.01)
*E21B 41/00* (2006.01)
(Continued)

(52) U.S. Cl.
CPC .......... *E21B 41/0092* (2013.01); *E21B 44/00* (2013.01); *E21B 47/022* (2013.01);
(Continued)

(58) Field of Classification Search
None
See application file for complete search history.

(56) References Cited

U.S. PATENT DOCUMENTS 5,765,653 A * 6/1998 Doster ...................... E21B 7/04
175/385
6,516,293 B1 2/2003 Huang et al.
(Continued)

FOREIGN PATENT DOCUMENTS

WO WO2010138137 A1 12/2010

OTHER PUBLICATIONS

Downton Challenges of Modeling Drilling systems for the Purposes of Automation and ControlProceedings of the 2012 IFAC Workshop on Automatic Control in Offshore Oil and Gas Production, May 31-Jun. 1, 2012 (Year: 2012).*
(Continued)

*Primary Examiner* — Rehana Perveen
*Assistant Examiner* — Cuong V Luu

(57) ABSTRACT

A method for selecting a bottomhole assembly (BHA) includes inputting BHA parameters, wellbore parameters, and drilling operating parameters, performing a dynamic simulation of a first BHA based on the BHA parameters, wellbore parameters, and drilling operating parameters, and presenting a wellbore quality factor of the first BHA calculated from the dynamic simulation.

19 Claims, 25 Drawing Sheets

(51) Int. Cl.
*E21B 44/00* (2006.01)
*E21B 47/022* (2012.01)
*E21B 47/08* (2012.01)
*E21B 49/00* (2006.01)
*E21B 49/08* (2006.01)

(52) U.S. Cl.
CPC .............. *E21B 47/08* (2013.01); *E21B 49/00* (2013.01); *E21B 49/08* (2013.01)

(56) References Cited

U.S. PATENT DOCUMENTS

| | | | | |
|---|---|---|---|---|
| 6,785,641 | B1* | 8/2004 | Huang | E21B 10/00 175/45 |
| 6,873,947 | B1 | 3/2005 | Huang et al. | |
| 7,020,597 | B2 | 3/2006 | Oliver et al. | |
| 7,139,689 | B2 | 11/2006 | Huang | |
| 7,258,175 | B2* | 8/2007 | Veeningen | E21B 10/00 175/39 |
| 7,464,013 | B2 | 12/2008 | Huang et al. | |
| 7,693,695 | B2 | 4/2010 | Huang et al. | |
| 7,844,426 | B2 | 11/2010 | Huang | |
| 8,401,831 | B2 | 3/2013 | Tang et al. | |
| 8,589,136 | B2* | 11/2013 | Ertas | E21B 7/00 166/369 |
| 9,482,055 | B2 | 11/2016 | Huang | |
| 2002/0103630 | A1* | 8/2002 | Aldred | E21B 44/00 703/10 |
| 2003/0010534 | A1* | 1/2003 | Chen | E21B 7/067 175/61 |
| 2004/0143427 | A1 | 7/2004 | Huang et al. | |
| 2004/0149431 | A1* | 8/2004 | Wylie | C09K 8/12 166/242.1 |
| 2004/0211596 | A1* | 10/2004 | Huang | E21B 10/00 175/38 |
| 2005/0015229 | A1* | 1/2005 | Huang | E21B 10/00 703/10 |
| 2005/0015231 | A1 | 1/2005 | Edwards et al. | |
| 2005/0060096 | A1* | 3/2005 | Hutchinson | E21B 44/00 702/6 |
| 2005/0132794 | A1* | 6/2005 | Spross | E21B 7/067 73/152.03 |
| 2005/0236184 | A1* | 10/2005 | Veeningen | E21B 10/00 175/40 |
| 2005/0279532 | A1* | 12/2005 | Ballantyne | E21B 47/12 175/40 |
| 2006/0162962 | A1* | 7/2006 | Koederitz | E21B 45/00 175/27 |
| 2006/0167668 | A1* | 7/2006 | Cariveau | E21B 10/00 703/7 |
| 2006/0254819 | A1* | 11/2006 | Moriarty | E21B 7/068 175/40 |
| 2006/0277009 | A1* | 12/2006 | Torres | E21B 10/00 703/6 |
| 2007/0021857 | A1* | 1/2007 | Huang | E21B 10/00 700/117 |
| 2007/0185696 | A1* | 8/2007 | Moran | E21B 44/00 703/10 |
| 2008/0255816 | A1 | 10/2008 | Neville | |
| 2008/0262810 | A1* | 10/2008 | Moran | E21B 7/00 703/10 |
| 2009/0032249 | A1 | 2/2009 | Morales et al. | |
| 2009/0055135 | A1* | 2/2009 | Tang | E21B 10/00 703/1 |
| 2010/0082256 | A1* | 4/2010 | Mauldin | E21B 12/02 702/9 |
| 2011/0025525 | A1* | 2/2011 | Akimov | G01V 11/00 340/853.2 |
| 2011/0147083 | A1* | 6/2011 | Mauldin | E21B 44/00 175/50 |
| 2011/0172976 | A1* | 7/2011 | Budiman | E21B 47/022 703/2 |
| 2011/0214878 | A1 | 9/2011 | Bailey et al. | |
| 2011/0280104 | A1* | 11/2011 | McClung, III | E21B 3/02 367/82 |
| 2012/0016589 | A1* | 1/2012 | Li | E21B 47/0006 702/9 |
| 2012/0130693 | A1* | 5/2012 | Ertas | E21B 44/00 703/2 |
| 2012/0255788 | A1* | 10/2012 | Schwefe | E21B 10/62 175/61 |
| 2012/0316787 | A1* | 12/2012 | Moran | E21B 44/00 702/9 |
| 2013/0049981 | A1* | 2/2013 | MacPherson | E21B 44/00 340/853.1 |
| 2014/0172303 | A1* | 6/2014 | Ibrahim | E21B 47/00 702/6 |
| 2014/0309978 | A1* | 10/2014 | Chen | E21B 41/00 703/7 |
| 2015/0134257 | A1* | 5/2015 | Erge | E21B 47/00 702/9 |
| 2015/0176344 | A1* | 6/2015 | McLoughlin | E21B 17/1078 175/24 |
| 2015/0176401 | A1* | 6/2015 | Samuel | E21B 44/00 702/6 |
| 2015/0233231 | A1* | 8/2015 | Rodney | E21B 47/0006 73/152.58 |
| 2017/0058658 | A1* | 3/2017 | Spencer | G06F 17/5004 |

OTHER PUBLICATIONS

Lanson Adam Endres Computation modeling of drill bits: a new method for reproducing bottom hole geometry and a second-order explicit integrator via composition for coupled rotating rigid bodies University of California, San Diego (Year: 2007).*

International Search Report and Written Opinion issued in International Patent Application No. PCT/US2015/037083, dated Oct. 6, 2015, 13 pages.

International Preliminary Report on Patentability issued in International Patent Application No. PCT/US2015/037083, dated Jan. 5, 2017, 12 pages.

* cited by examiner

METHODS FOR ANALYZING AND OPTIMIZING DRILLING TOOL ASSEMBLIES

BACKGROUND

Operations, such as geophysical surveying, drilling, drilling, logging, well completion, hydraulic fracturing, steam injection, and production, are typically performed to locate and gather valuable subterranean assets, such as valuable fluids or minerals. The subterranean assets are not limited to hydrocarbons such as oil or gas. After gathering valuable subterranean assets, operations such as well abandonment may involve the sealing of a well to safely and economically decommission a well.

SUMMARY

In one or more embodiments of the present disclosure, a system for selecting a bottomhole assembly (BHA) includes a computing device having a computing processor executing instructions to perform: executing a first simulation to generate a first wellbore quality factor, and executing a second simulation to generate a second wellbore quality factor. The computing device may include a graphical user interface executing on the computer processor with functionality to perform: inputting at least one BHA parameter, at least one wellbore parameter, and at least one drilling operating parameter, presenting, on the graphical user interface, the first wellbore quality factor from the first simulation, the first simulation based on the at least one BHA parameter, the at least one wellbore parameter, and the at least one drilling operating parameter, modifying, based on the first wellbore quality factor, at least one of the parameters, wherein modifying involves changing a value of the at least one parameter to obtain a modified parameter, presenting, on the graphical user interface, the second wellbore quality factor from the second simulation, the second simulation based on the modified parameter, and selecting a BHA based on the first and second wellbore quality factors.

In one or more embodiments of the present disclosure, a method for selecting a bottomhole assembly (BHA) includes inputting BHA parameters, wellbore parameters, and drilling operating parameters, performing a dynamic simulation of a first BHA based on the BHA parameters, wellbore parameters, and drilling operating parameters, and presenting a wellbore quality factor of the first BHA calculated from the dynamic simulation.

In one or more embodiments of the present disclosure, a method of designing a bottomhole assembly (BHA) includes obtaining a plurality of field data, inputting a plurality of BHA parameters, wellbore parameters, and drilling operating parameters corresponding to a field environment, performing a dynamic simulation of a first BHA based on the plurality of BHA parameters, wellbore parameters, and drilling operating parameters, presenting a first wellbore quality factor calculated from the dynamic simulation of the first BHA, and comparing the first wellbore quality factor to the plurality of field data.

In one or more embodiments of the present disclosure, a non-transitory computer readable medium includes executable instructions for selecting a BHA, the executable instructions having functionality to: input, using a graphical user interface, BHA parameters, wellbore parameters, and drilling operating parameters, perform a dynamic simulation of a first BHA based on the BHA parameters, wellbore parameters, and drilling operating parameters, and present, on the graphical user interface, a first wellbore quality factor of the first BHA calculated from the dynamic simulation.

This summary is provided to introduce a selection of concepts that are further described below in the detailed description. This summary is not intended to identify key or essential features of the claimed subject matter, nor is it intended to be used as an aid in limiting the scope of the claimed subject matter. Other aspects and advantages of the disclosure will be apparent from the following description and the appended claims.

DETAILED DESCRIPTION

Figure 1:
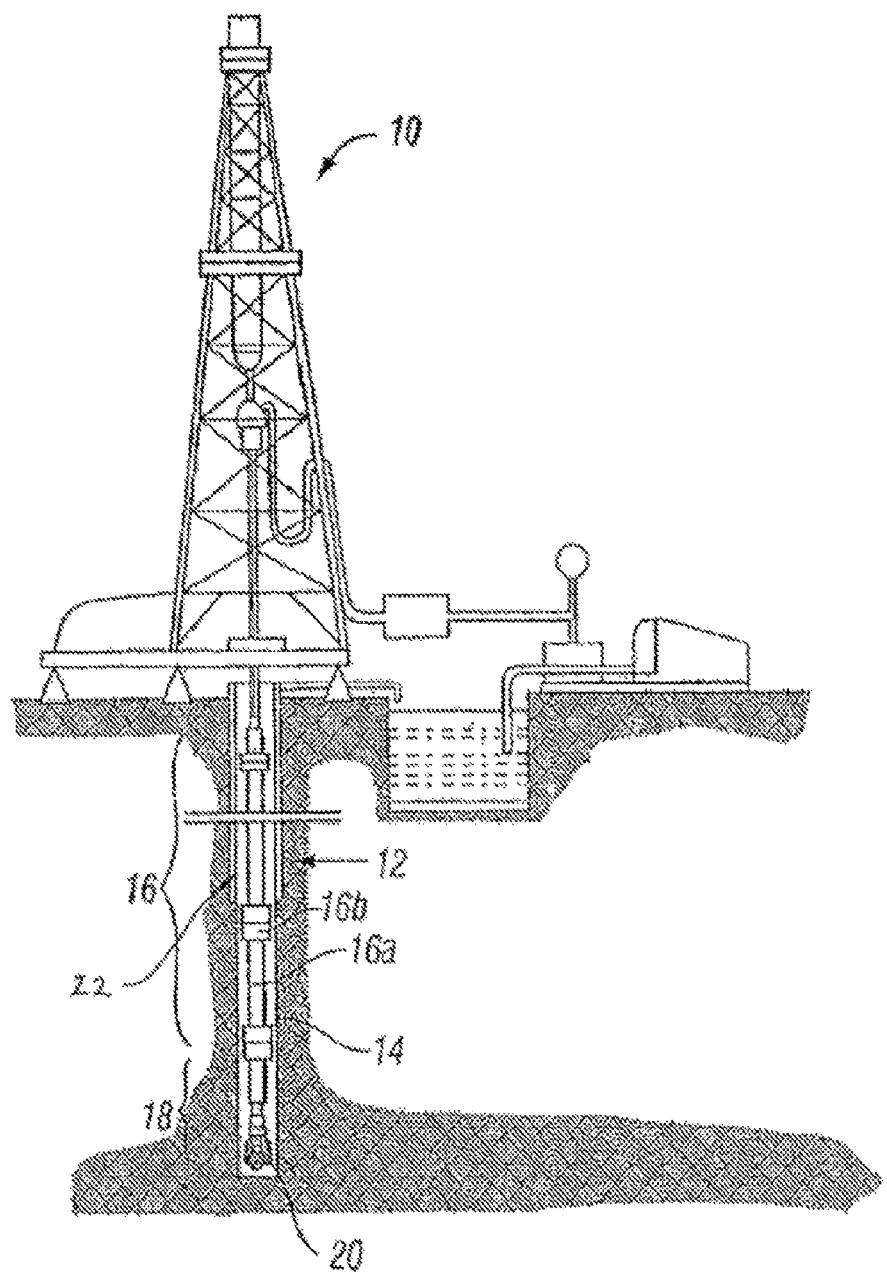
FIG. 1 shows a conventional drilling system for drilling an earth formation.

Embodiments are shown in the above-identified drawings and described below. In describing the embodiments, like or identical reference numerals are used to identify common or similar elements. The drawings are not necessarily to scale and certain features may be shown exaggerated in scale or in schematic in the interest of clarity and conciseness.

While most of the terms used herein will be recognizable to those of skill in the art, it should be understood, however, that when not explicitly defined, terms should be interpreted as adopting a meaning presently accepted by those skilled in the art.

Throughout this document, the terms "oilfield" and "oilfield operation" may be used interchangeably with the terms "field" and "field operation" to refer to a site where any types of valuable fluids or minerals can be found and the activities required to extract them. The terms may also refer to sites where substances are deposited or stored by injecting them into subterranean structures using boreholes and the operations associated with this process. Further, the term "field operation" refers to a field operation associated with a field, including activities related to field planning, wellbore drilling, wellbore completion, production using the wellbore (also referred to as borehole), and abandonment of a well after production has completed (well sealing).

FIG. 1 shows one example of a conventional drilling system for drilling an earth formation. The drilling system includes a drilling rig 10 used to turn a drilling tool assembly 12 that extends downward into a wellbore 14. The drilling tool assembly 12 includes a drill string 16, and a bottomhole assembly (BHA) 18, which is attached to the distal end of the drill string 16. The "distal end" of the drill string is the end furthest from the drilling rig.

The drill string 16 includes several joints of drill pipe 16a connected end to end through tool joints 16b. The drill string 16 is used to transmit drilling fluid (through its hollow core) and to transmit rotational power from the drill rig 10 to the BHA 18. In some cases the drill string 16 further includes additional components such as subs, pup joints, etc.

The BHA 18 includes at least a bit 20. BHAs may also include additional components attached between the drill string 16 and the bit 20. Examples of additional BHA components include drill collars, stabilizers ("stabs"), measurement-while-drilling (MWD) tools, logging-while-drilling (LWD) tools, subs, hole enlargement devices (e.g., hole openers and reamers), jars, accelerators, thrusters, downhole motors, and rotary steerable systems.

Drilling typically refers to using a drill bit (e.g., bit 20, FIG. 1) to remove earth formation at a distal end of a borehole. When drilling, rotational moment and axial force is applied to the bit 20 to cause the cutting elements of the bit 20 to cut into material and/or crush formation as the bit 20 is rotated. The axial force applied on the bit 20 is referred to as the "weight on bit" (WOB). The rotational moment applied to the drilling tool assembly 12 at the drill rig 10 (e.g., by a rotary table or a top drive mechanism) to turn the drilling tool assembly 12 is referred to as the "rotary torque." Additionally, the speed at which the rotary table rotates the drilling tool assembly 12, measured in revolutions per minute (RPM), is referred to as the "rotary speed."

Figure 2:
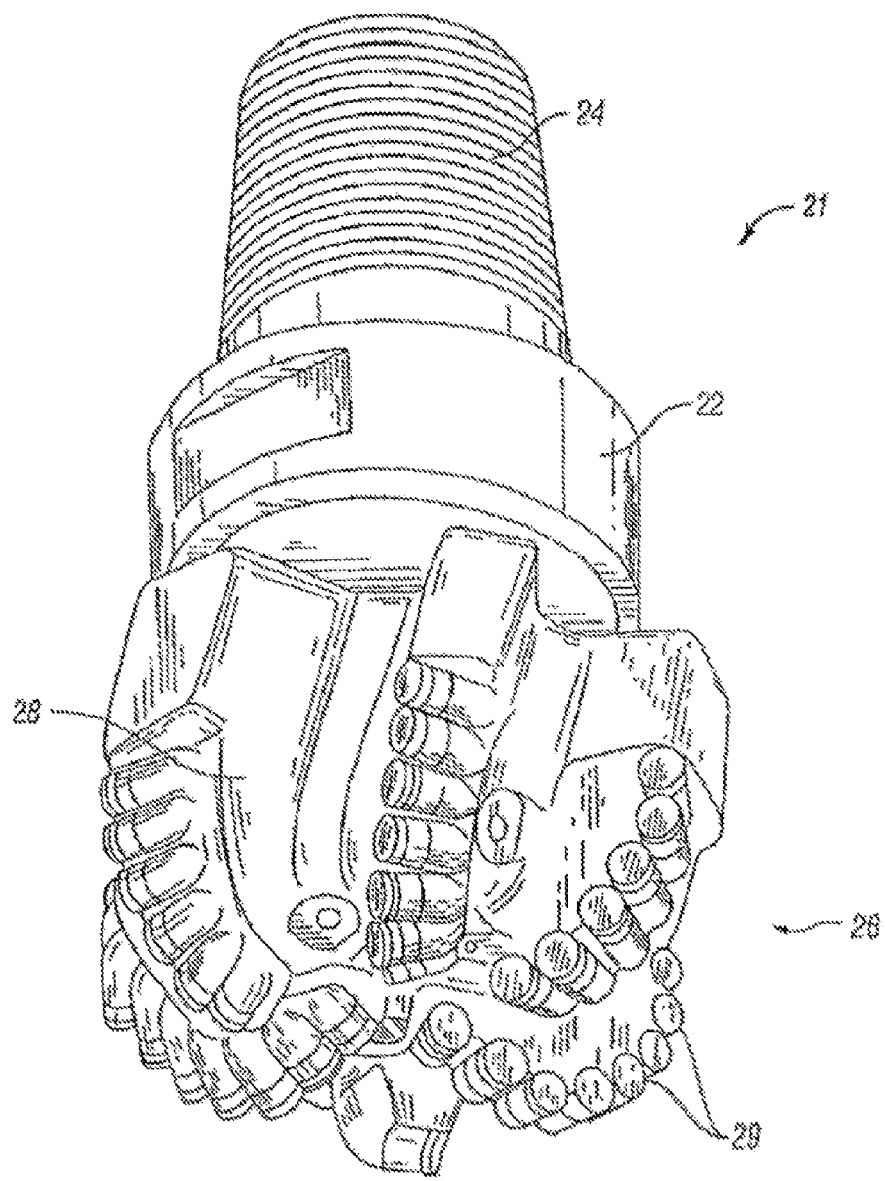
FIG. 2 shows a conventional fixed-cutter bit.

Referring to FIG. 2, an example of a drill bit known as a fixed-cutter bit is shown. Fixed-cutter bit 21 has a bit body 22 having a threaded connection at one end 24 and a cutting head 26 formed at the other end. The head 26 of the fixed-cutter bit 21 includes a plurality of ribs or blades 28 arranged about the rotational axis of the drill bit and extending radially outward from the bit body 22. Cutting elements 29 are embedded in the raised ribs 28 to cut formation as the drill bit is rotated on a bottom surface of a well bore. Cutting elements 29 of fixed-cutter bits include polycrystalline diamond compacts (PDC) or specially manufactured diamond cutters. These drill bits are also referred to as PDC bits or drag bits.

During drilling, a variety of factors affect the performance and ultimately the success of a drilling operation. For example, the inconsistencies of the earth formation being drilled through as well as the different components and parameters of the drilling system affect factors such as how fast a drill bit is capable of penetrating the earth (rate of penetration, or ROP) and how much degradation of the drill bit (and the drilling system) occurs (e.g., bit grading and/or wear rate). In addition, in order to optimize performance, engineers may consider a variety of factors. For example, when selecting and/or designing a drilling system, engineers may consider a rock profile (e.g., the type of rock and/or the geological, physical, and mechanical characteristics of an earth formation), operating parameters, and/or drill bit parameters, among many others. Engineers may also consider the quality of the wellbore being drilled through the earth formation. Wellbore quality may include a number of characteristics that may be optimized using a simulation according to one or more embodiments disclosed herein. For sake of clarity, a number of definitions are provided below.

"BHA parameters" may include one or more of the following: the type, location, and/or number of components included in the drilling tool assembly; the length, internal diameter of components, outer diameter of components, weight, and/or material properties of each component; the type, size, weight, configuration, and/or material properties of the drilling tool; and/or the type, size, number, location, orientation, and/or material properties of the cutting elements on the drilling tool. Material properties in designing a drilling tool assembly may include, for example, the strength, elasticity, and/or density of the material. It should be understood that drilling tool assembly design parameters may include any other configuration or material property of the drilling tool assembly without departing from the scope of the disclosure.

"Bit parameters," which are a subset of BHA parameters, may include one or more of the following: bit type, size of bit, shape of bit, cutting structures on the bit, such as cutting type, cutting element geometry, number of cutting structures, and/or location of cutting structures. As with other components in the drilling tool assembly, the material properties of the bit may be defined.

"Drilling operating parameters" may include one or more of the following: the rotary table (or top drive mechanism), speed at which the drilling tool assembly is rotated (RPM), the downhole motor speed (if a downhole motor is included) and/or the hook load. Drilling operating parameters may further include drilling fluid parameters, such as the viscosity and/or density of the drilling fluid, for example. It should be understood that drilling operating parameters are not limited to these variables. In other embodiments, drilling operating parameters may include other variables, e.g., rotary torque, drilling fluid flow rate, dip angle (e.g., the magnitude of the inclination of the formation from horizontal), and/or strike angle (e.g., the azimuth of the intersection of a plane with a horizontal surface). Additionally, drilling operating parameters for the purpose of drilling simulation may further include the total number of drill bit revolutions to be simulated, the total distance to be drilled, or the total drilling time desired for drilling simulation. Drilling operating parameters may also include drilling mode, which refers to the motion of the drilling tool assembly, such as whether the drilling tool assembly is sliding or rotating. Sliding refers to an drilling operation where the drilling tool assembly is pushed through the earth to remove earth material, whereas rotating refers to both pushing and rotating (e.g., about a central axis) a drilling tool assembly through the earth to remove earth material.

"Drilling performance" may be measured by one or more drilling performance parameters. Examples of drilling performance parameters include rate of penetration (ROP), rotary torque required to turn the drilling tool assembly, rotary speed at which the drilling tool assembly is turned, drilling tool assembly lateral, axial, or torsional vibrations and accelerations induced during drilling, weight on bit (WOB), forces acting on components of the drilling tool assembly, and/or forces acting on the drill bit and components of the drill bit (e.g., on blades and/or cutting elements). Drilling performance parameters may also include the inclination angle and/or azimuth direction of the borehole being drilled, build up rate, bit path, and/or walk rate. The "build rate" or "build up rate" is the positive change in inclination over a normalized length (e.g., 3°/100 ft.). One skilled in the art will appreciate that other drilling performance parameters exist and may be considered without departing from the scope of the disclosure.

The method used to obtain the measurements to calculate and plot a 3D well path is called a directional survey. Three parameters are measured at multiple locations along the well path—measure depth (MD), inclination, and hole direction. MD is the actual depth of the hole drilled to any point along the wellbore or the total depth as measured from the surface location. Inclination is the angle, measured in degrees, by which the wellbore or survey-instrument axis varies from a true vertical line. An inclination of 0° would be true vertical, and an inclination of 90° would be horizontal. Hole direction is the angle, measured in degrees, of the horizontal component of the borehole or survey-instrument axis from a known north reference. This reference is true north, magnetic north, or grid north, and is measured clockwise by convention. Hole direction is measured in degrees and is expressed in either azimuth (0 to 360°) or quadrant (Northeast (NE), Southeast (SE), Southwest (SW), Northwest (NW)) form. A negative change in inclination would be the "drop rate."

A long-radius horizontal well is characterized by build rates of 2 to 6°/100 ft, which result in a radius of 3,000 to 1,000 ft, respectively. This profile is typically drilled with conventional directional-drilling tools, and lateral sections of up to 8,000 ft have been drilled. Medium-radius horizontal wells have build rates of 6 to 35°/100 ft, radii of 1,000 to 160 ft, respectively, and lateral sections of up to 8,000 ft. These wells are drilled with specialized downhole mud motors and conventional drillstring components. Double-bend assemblies are designed to build angles at rates up to 35°/100 ft. The lateral section is often drilled with conventional steerable motor assemblies. Short-radius horizontal wells have build rates of 5 to 10°/3 ft (1.5 to 3°/ft), which equates to radii of 40 to 20 ft, respectively. The length of the lateral section varies between 200 and 900 ft. Short-radius wells are drilled with specialized drilling tools and techniques. This profile is most commonly drilled as a re-entry from any existing well.

As used herein, a "drilling simulation" is a dynamic simulation of a BHA used in a drilling operation. The drilling simulation is referred to as being "dynamic" because the drilling is a "transient time simulation," meaning that it is based on time or the incremental rotation of the drilling tool assembly. Such simulations include those disclosed in U.S. Pat. Nos. 6,516,293, 6,873,947, 7,844,426, 7,139,689, 6,785,641, 8,401,831, and 7,464,013 as well as U.S. patent application Ser. Nos. 10/749,019, 10/852,574, 10/851,677, 10/888,358, and 10/888,446, all of which are incorporated by reference in their entirety.

The drilling simulation may be performed using one or more of the methods set forth above. In one or more embodiments, the BHA is modeled with beam elements (using finite element analysis (FEA) techniques as known in the art). Briefly, FEA involves dividing a body under study into a finite number of pieces (subdomains) called elements. Particular assumptions are then made on the variation of the unknown dependent variable(s) across each element using so-called interpolation or approximation functions. This approximated variation is quantified in terms of solution values at special element locations called nodes.

Through this discretization process, the method sets up an algebraic system of equations for unknown nodal values which approximate the continuous solution. Because element size, shape and approximating scheme can be varied to suit the problem, the method can accurately simulate solutions to problems of complex geometry and loading.

In one or more embodiments, the simulation provides visual outputs of performance parameters and/or wellbore quality factors. Further, the outputs may include tabular data or may be in the form of graphs, charts, and/or logs, of a parameter, for example. Other plots may include presentation or visualization of the results at a minimum or maximum value, or any combination of those results. A graphical visualization of the borehole, drill bit, drill string, and/or the drilling tools (e.g., a hole opener) may also be output. The graphical visualization (e.g., 2-D, 3-D, or 4-D) may include a color scheme for the wellbore, drill string, and/or BHA.

"Well bore parameters" may include one or more of the following: the geometry of a well bore and/or formation material properties (i.e. geologic characteristics). The trajectory of a well bore in which the drilling tool assembly is to be confined also is defined along with an initial well bore bottom surface geometry. Because the well bore trajectory may be straight, curved, or a combination of straight and curved sections, well bore trajectories, in general, may be defined by defining parameters for each segment of the trajectory. For example, a well bore may be defined as including N segments characterized by the length, diameter, inclination angle, and azimuth direction of each segment and an indication of the order of the segments (i.e., first, second, etc.). Well bore parameters defined in this manner can then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore, casing and cement properties, and well bore fluid properties, among others, without departing from the scope of the disclosure.

In addition, in one or more embodiments, a wellbore may be planned or proposed by an engineer. The planning of a wellbore may include the wellbore trajectory, wellbore shape and direction of drilling, wellbore total depth and completion depth, the number and depth of any sidetracked borehole(s), among many others. For directional drilling, well planning may require a number of other considerations such as where to begin drilling the well (e.g., the position along the surface or at what depth a sidetracked borehole may begin to be drilled), the completion process of the well, among many others. Well planning may also include operational parameters such as drilling parameters, operating parameters, and/or wellbore parameters, as mentioned above, as well as drilling procedures such as, for example, motor rotating sequence, motor sliding sequence, motor rotating time, and/or motor sliding time. In addition, well planning parameters may include any other parameter known in the art or described herein in order to optimize production from a particular reservoir/formation including BHA design parameters such as, for example, BHA parameters and/or bit parameters.

During drilling, the path on which the BHA drills along is known as the bit path and may be affected due to axial vibrations, lateral vibrations, casing materials, drilling components and their properties, among many other factors that influence the BHA. When the BHA bit path deviates from the expected bit path, the BHA is said to have a walking tendency and is commonly associated with a direction (e.g., left, right, east, or west) and is measured with respect to a cross-section of the borehole. Should the BHA deviate from the expected bit path, the BHA would be considered to have a tendency of walking to the right or left with respect to a cross-section of the borehole, depending on the direction in which the BHA deviates. In general, these walking tendencies affect quality of the wellbore, such as, for example, the trajectory of the borehole being drilled may deviate from the planned trajectory and the performance of a particular drilling system may be affected by the change in trajectory.

Wellbore quality refers to quantitative and qualitative measurements and/or analysis of a wellbore and may include the analysis of one or more wellbore quality factors. Examples of wellbore quality factors include the borehole shape, size (e.g., diameter), position, smoothness, roundness, and/or other characteristics of the borehole profile (e.g., side profile and/or cross-sectional profile), among many others. In addition, diameter variation and/or the size of a given borehole compared to the expected or planned size of the borehole may also be analyzed to determine the quality of a borehole. Other wellbore quality factors may include, but are not limited to, wall quality, effective diameter, bit path and/or movement, borehole diameter, well profile, well trajectory, and/or well center position. Further, the quality of a given wellbore may be affected by tortuosity (i.e., the number of twists exhibited by the borehole trajectory as well as the severity of twisting), spiraling (i.e., a borehole trajectory that exhibits winding or spiraling about a center axis of borehole), and ledging (i.e., an abnormal deviation of a drill bit from the center axis of a borehole, often momentarily and inconsistently, observed in the trajectory of a borehole).

Figure 3A:
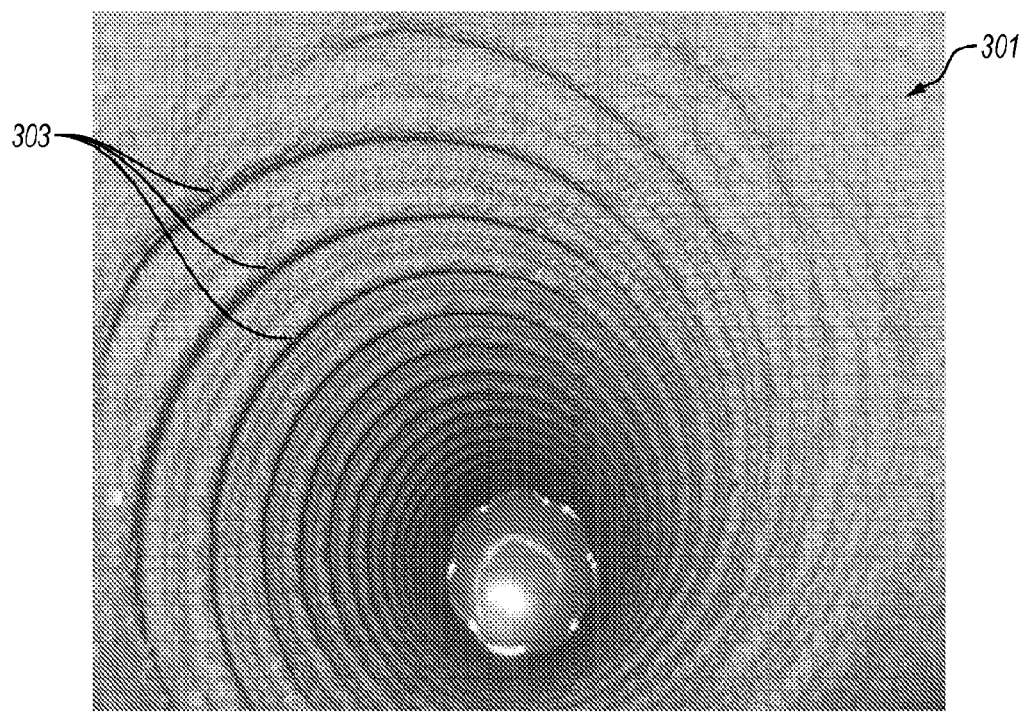
FIGS. 3A-3B show examples of spiraling and ledging.

For example, referring to FIG. 3A, an example of spiraling is shown. Specifically, as shown in FIG. 3A, a through-hole view of a drilled borehole 301 (i.e., a view looking down a borehole that was drilled) shows indications of spiraling along the borehole wall. Hole spiraling is a complex phenomenon. It can be caused by bit whirling, lack of bit stabilization, steering force from rotary steerable tools, or the interaction between bit, stabilizer and borehole and/or hole walls, among many others. Spiraling is observed due to the repetition of threads 303 (i.e., uncut earth material along the borehole wall) traversing the wall of the borehole in a given direction. Spiraling may be observed to exhibit a helical pattern. In addition, spiraling may also be categorized based on the number of threads over a given distance drilled and/or the distance between two threads. This is commonly referred to as pitch length. The spiraling of a borehole may be said to have a short pitch length when a short distance is observed between each thread (e.g., a couple centimeters). Medium pitch length is on the order of tens of centimeters, whereas long pitch length is on the order of meters. A drilled hole may have other undesirable features such as sinusoidal trajectory (trajectory that varies in a plane) and/or may exhibit an hourglass shape (due to a periodic change in borehole size). One of ordinary skill would appreciate that other undesirable hole propagation patterns may exist and that the borehole shown is FIG. 3A is an example that should not limit the scope of the present disclosure.

Figure 3B:
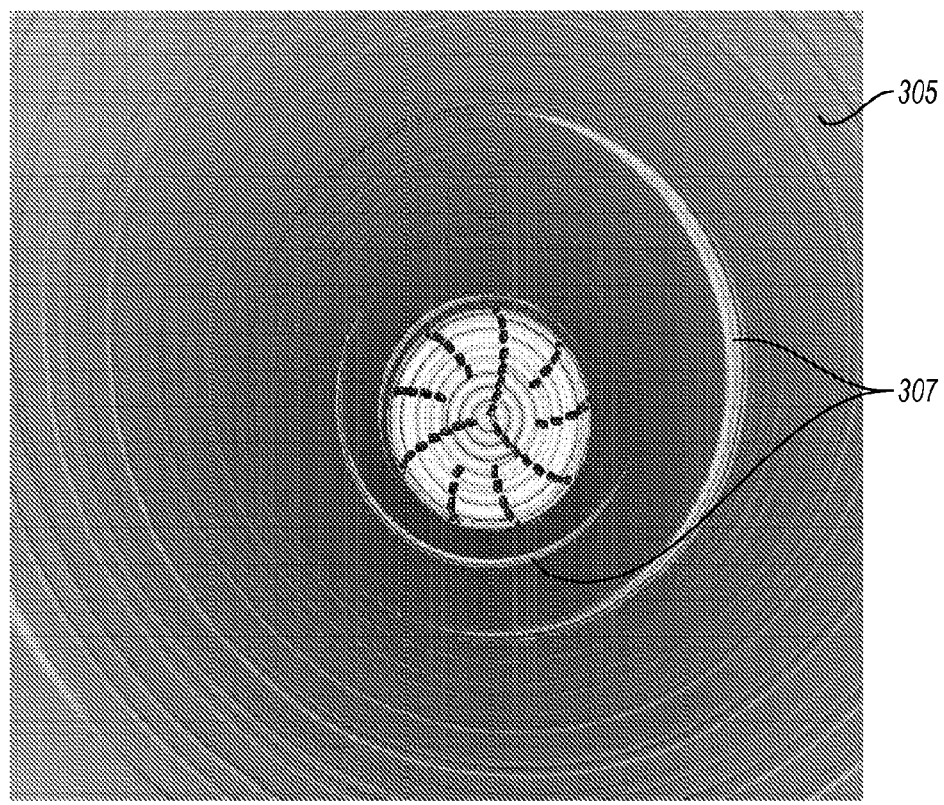

Referring now to FIG. 3B, an example of ledging is shown. Specifically, as shown in FIG. 3B, a through-hole view of a drilled borehole 305 (i.e., a view looking down a borehole that was drilled) shows indications of ledging along the borehole wall. Ledging may be generated when changing from rotating mode to sliding mode, or when drilling with a mud motor. Ledging may also be observed when the formation being drilling through is inhomogeneous. Ledging occurs when at least one ledge of uncut earth material traversing the wall of the borehole in a given direction is observed. As shown in this example, ledges 307 are observed along the borehole wall. As shown, the distance between ledges 307 is often inconsistent. One of ordinary skill would appreciate that other ledging characteristics may exist and the borehole shown is FIG. 3B is an example and should not to limit the scope of the present disclosure.

Figure 4A:
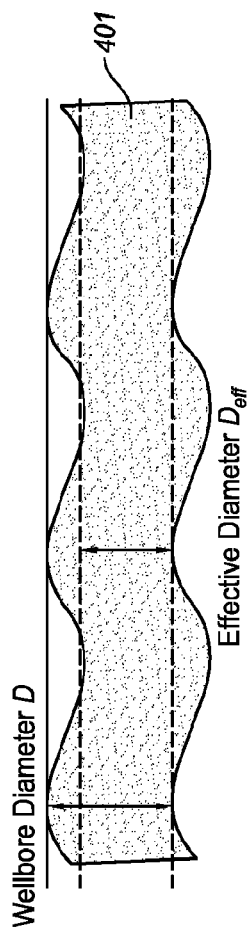
FIGS. 4A-4B depict an example of borehole diameter.
Figure 4B:
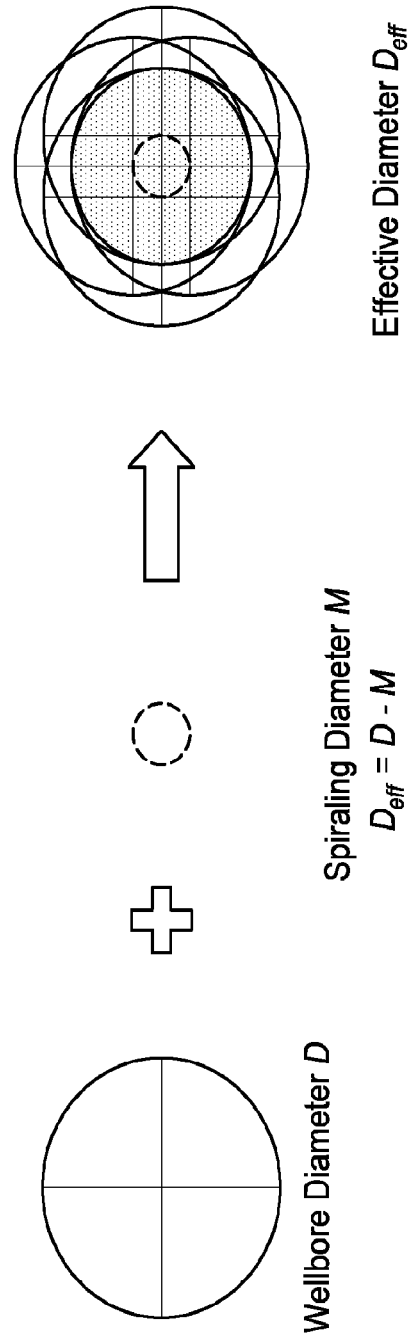

Referring now to FIGS. 4A-4B, an example of effective borehole diameter is shown. In FIG. 4A, a two-dimensional trajectory of borehole 401 is shown. In this example, the borehole trajectory exhibits spiraling. As mentioned above, spiraling and other undesired effects of drilling may cause a number of issues. For example, in FIG. 4A, the diameter of the borehole cut by a drill bit is shown as diameter D. However, due to spiraling, the resulting effective diameter $D_{eff}$ (i.e., the largest diameter in which a tool may be efficiently passed through a borehole) is less than the diameter D of the borehole cut by the drill bit. As more accurately illustrated in FIG. 4B, the wellbore diameter D represents the diameter of the borehole cut by a particular drilling tool assembly. Due to spiraling having a diameter M, the resulting effective diameter of borehole $D_{eff}$ is observed to be less than the anticipated or expected wellbore diameter D as cut by the drilling tool assembly. Thus, although the drill bit is drilling a borehole at a particular diameter D, the smaller effective diameter $D_{eff}$ is often what engineers are left with when considering the type of equipment and operating parameters that may be used downhole.

The aforementioned problems may be increasingly significant when dealing with directional wells. Successful drilling operations require appropriate selection of drilling tools, fluids, and techniques. Drill bits, or similar cutting tools, should be appropriate for the borehole conditions and the materials to be removed. The fluids should be capable of removing drilled material from the wellbore. Additionally, the techniques employed should be appropriate for the anticipated conditions in order to achieve operation objectives.

Furthermore, significant expense may be involved in the design and manufacture of BHAs. Therefore, in order to optimize performance, engineers may consider a variety of factors. For example, when selecting and/or designing a BHA, engineers may consider a rock profile (e.g., the type of rock or the geologic characteristics of an earth formation), different forces acting on the BHA, drilling performance parameters, drill bit parameters, well bore parameters, and/or the quality of a drilled borehole, among many others. However, without accurate models or simulations of BHAs and how they operate in a given condition, engineers may not be provided with enough quantitative and/or substantial information to make an optimal or preferred BHA choice. Therefore, comparison of different drill bits along with comparison of different drill bit parameters, wellbore parameters, and/or drilling operating parameters may be helpful in determining the optimal BHA to achieve a quality borehole.

Accordingly, embodiments disclosed herein include methods and techniques to model the behavior of various BHA packages under multiple conditions to achieve an optimal or improved BHA package for a given drilling operation, e.g., to achieve a quality borehole. More particularly, one or more embodiments disclosed herein include methods of directly comparing various BHA packages (against selected criteria or against each other) to determine which package may be the preferred one.

Embodiments of the present disclosure include a method of analyzing the quality of a particular wellbore being drilled, or to be drilled. The quality of a particular wellbore may then be used to determine an optimal or improved BHA to be used in a given oilfield operation. Having a quality borehole may allow for better ROP, lower vibrations on a particular downhole assembly, more accurate logging and acquired data, and reduced torque and drag experienced by a downhole assembly, among others.

Figure 5:
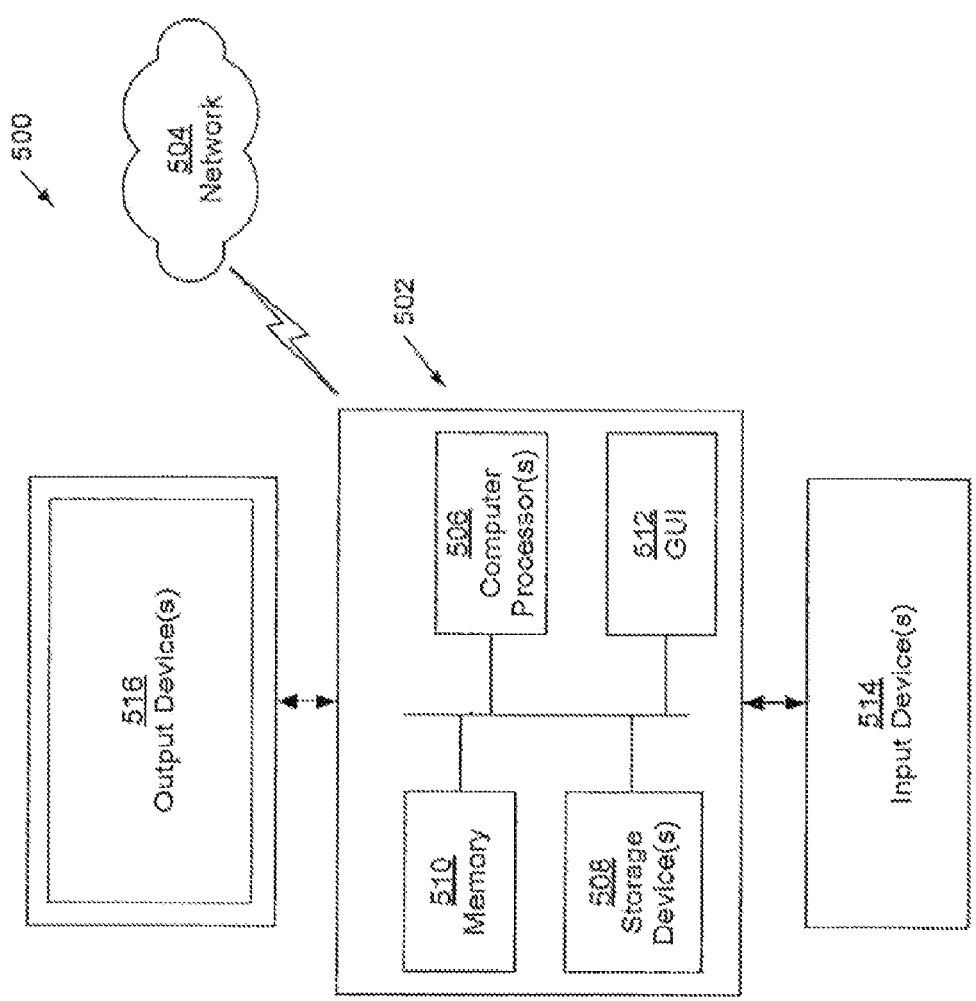
FIG. 5 shows a system according to one or more embodiments of the present disclosure.

FIG. 5 depicts a system with which one or more embodiments of selecting a BHA or designing a BHA may be implemented. In one or more embodiments, one or more of the modules and elements shown in FIG. 5 may be omitted, repeated, and/or substituted. Accordingly, embodiments of selecting a BHA, designing a BHA, or planning a well should not be considered limited to the specific arrangements of modules shown in FIG. 5.

In one or more embodiments, a BHA may be selected or designed. Referring to FIG. 5, a system 500 includes a computing device 502 having one or more computing processors 506, one or more storage devices 508 (e.g., a hard disk, an optical drive such as a compact disk (CD) drive or digital versatile disk (DVD) drive, a flash memory stick, etc.), memory 510 (e.g., random access memory (RAM), cache memory, flash memory, etc.), and a graphical user interface (GUI) 512. The computing processor(s) 506 may be an integrated circuit for processing instructions. For example, the computing processor(s) may be one or more cores, or micro-cores of a processor. The storage device(s) 508 (and/or any information stored therein) may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The storage device(s) 508 may be a device internal to the computing device 502. In some embodiments, the storage device(s) 508 may be an external storage device operatively connected to the computing device 502. Additionally, the computing device 502 may include numerous other elements and functionalities.

The computing device 502 may be communicatively coupled to a network 504 (e.g., a local area network (LAN), a wide area network (WAN) such as the Internet, mobile network, or any other type of network) through wires, cables, fibers, optical connectors, a wireless connection, or a network interface connection (not shown).

The system 500 may also include one or more input device(s) 514, such as a touchscreen, keyboard, mouse, microphone, touchpad, electronic pen, or any other type of input device. Further, the system 500 may include one or more output device(s) 516, such as a screen (e.g., a liquid crystal display (LCD), a plasma display, touchscreen, cathode ray tube (CRT) monitor, projector, 2D display, 3D display, or other display device), a printer, external storage, or any other output device. One or more of the output device(s) 516 may be the same or different from the input device(s). The input and output device(s) may be locally or remotely (e.g., via the network 504) connected to the computer processor(s) (506), memory (510), storage device(s) (508), and GUI 512. Many different types of systems exist, and the aforementioned input and output device(s) may take other forms.

Further, one or more elements of the aforementioned system 500 may be located at a remote location and connected to the other elements over a network 504. Further, embodiments of the disclosure may be implemented on a distributed system having a plurality of nodes, where each portion of the disclosure may be located on a different node within the distributed system. In some embodiments of the disclosure, the node corresponds to a distinct computing device. In some embodiments, the node may correspond to a computer processor with associated physical memory or a computer processor or micro-core of a computer processor with shared memory and/or resources.

The GUI 512 may operated by a user (e.g., an engineer, a designer, an operator, an employee, or any other party) using one or more input devices 514 and the GUI 512 may be visualized one or more output devices 516 coupled to the computing device 502. The GUI may include one or more buttons (e.g., radio buttons), data fields (e.g., input fields), banners, menus (e.g., user input menus), boxes (e.g., input or output text boxes), tables (e.g., data summary tables), sections (e.g., informational sections or sections capable of minimizing/maximizing), screens (e.g., welcome screen or home screen), and/or user selection menus (e.g., drop down menus). In addition, the GUI may include one or more separate interfaces and may be usable in a web browser or as a standalone application.

Although the output device(s) 516 is shown as being communicatively coupled to the computing device 502, the output device(s) 516 may also be a component of the computing device 502.

In FIG. 5, the computing device 502 is capable of simulating a BHA. The BHA to be simulated may be selected, by a user, from a pre-existing library of BHAs (not shown) or a BHA may be customized, by the user, using the GUI 512 of the computing device 502. The user may customize the BHA by inputting or selecting a variety of drilling components (e.g., type of drill, number of cutters, material properties of the drill, or any other BHA or bit parameter known in the art or disclosed herein).

Additionally, the simulation may be customized by inputting or selecting a variety of well bore parameters and drilling operating parameters. To modify the BHA and/or customize the BHA or simulation, the user may access storage devices(s) 508 using any input means known in the art (e.g., input device(s) 514). The storage device(s) 508 is capable of having data stored thereon and may include, for example, rock profiles, BHA parameters and components, and/or drilling operating parameter, among many others. Once the user customizes the BHA and other simulation parameters, the computing device 502 may execute instructions on the computing processor(s) 506 to perform a simulation based on the customized BHA and the parameters selected or input by the user.

In addition, the BHA may be selected for simulation or modified based on data input or selected by the user. The user may also modify a BHA based on particular drilling operating parameters, wellbore parameters, or any other conditions known in the art or disclosed herein. For example, a user may determine a preferred WOB or ROP and may modify the BHA accordingly taking into account the preferred WOB and/or ROP, among others using the GUI.

Once the user customizes the BHA and other simulation parameters, the computing device 502 may execute instructions on the computing processor(s) 506 to perform a simulation based on the customized BHA and the parameters selected or input by the user. The drilling simulation may be performed using one or more of the methods set forth above. Executing the simulation generates a set of performance data. In some cases, the set of performance data generated may depend on the data selected or input by the user and may include instructions to generate specific performance data, as mentioned above. In other embodiments, the executed simulation may generate one or more wellbore quality factors including, but not limited to, wall quality, effective diameter, spiraling, ledging, tortuosity, bit path and/or movement, borehole diameter, well profile, well trajectory, well center position, and/or visualizations of a borehole in 2D and/or 3D.

After simulation, the wellbore quality or other performance factors may then be visualized by the GUI 512 on the output device(s) 516. In one embodiment, the visual outputs may include tabular data of one or more performance parameters. Additionally, the outputs may be in the form of graphs and may be represented as percentages or ratios. A graphical visualization of the borehole, drill bit, blades, and/or cutters may be output. The graphical visualization (e.g., 2-D, 3-D, or 4-D) may include a color scheme.

Once presented with the wellbore quality or other performance factors, the user may modify at least one BHA parameter, wellbore parameter, or drilling operating parameter. Modification may involve selecting a parameter from pre-existing values or inputting the parameter to obtain a modified BHA, wellbore, and/or drilling operation. The pre-existing values may depend on manufacturing capabilities or geometries of the components of the BHA.

After modification, a second simulation may be executed by the computing device 502. The second simulation may include the modified parameter to be simulated. The simulation may be executed by the computing device 502 using the processor(s) 506 to generate a second set of performance data or wellbore quality factors. The drilling simulation may be performed using one or more of the methods set forth above. Once generated, the initial set of data along with the second set of data may be presented using GUI 512 and output device(s) 516. The sets of data may be presented to the user for comparison and may be presented separately or combined. The sets of data may be presented or visualized using any tools known in the art, such as, for example, plots, graphs, charts, and/or logs.

Additionally, a second simulation may occur simultaneously with the first simulation. For example, an engineer may select a number of BHAs to operate in particular wellbore and drilling operating conditions. The engineer may then run a simulation of the number of BHAs in order to compare one BHA to another. Furthermore, the simulation and thus, the comparison, may be done in real-time. More specifically, the engineer may simulate a number of BHAs in a given drilling scenario and observe their behaviors and/or performance with respect to each other as the simulation progresses. Additionally, an engineer may observe the quality of the borehole being drilled by the one or more BHAs and select or modify one or more of the aforementioned parameters accordingly in order to achieve desired performance results or a desired wellbore quality.

In some embodiments, the computing device 502 may be used to plan a well or modify a given well plan. Referring still to FIG. 5, the computing device 502 may perform a simulation to generate one or more wellbore quality factors. The simulation may be performed based on a pre-determined well plan and/or a proposed well plan. The simulation may also include a number of pre-determined and/or proposed wellbore, drilling, and/or operating parameters. Based on the generated one or more wellbore quality factors, an operating, wellbore, and/or drilling parameter may be modified. Further, in addition to, or in the alternative, a well planning parameter may be modified based on the one or more wellbore quality factors generated by the simulation.

Using the modified parameter, a second simulation may be performed by the computing device 502 in order to generate a second wellbore quality factor. Thereafter, the first and second wellbore quality factors may be compared to one another or may be compared to a given criteria. Based on the comparison, a well planning parameter, such as wellbore trajectory, and/or any other well planning parameter noted above, may be modified in order to optimize a particular well plan and/or achieve better well quality. Modification of any number of parameters, such as motor rotating sequence, motor sliding sequence, motor rotating time, and/or motor sliding time, among others, may be repeated until a desired well plan or wellbore quality is obtained. The desired well plan may then be implemented in an oilfield operation.

During implementation, data may be acquired and/or measured in the field. The obtained data may then be used to compare to one or more field acquired/measured parameters to one or more parameters generated by simulation. Additionally, obtained data may be used as input to a simulation in real time, such that one or more parameters may be generated by simulations based on the obtained data. Thereafter, real time modifications to a well plan may be made in order to optimize the oilfield operation. Real time modification may be beneficial in remedying any unforeseen conditions or improbable situations that may have not been considered during the initial well plan, such as, inhomogeneity of a particular formation, unexpected drill bit failure, and/or inconsistent and/or one or more uncontrollable operating parameters.

Figure 6A:
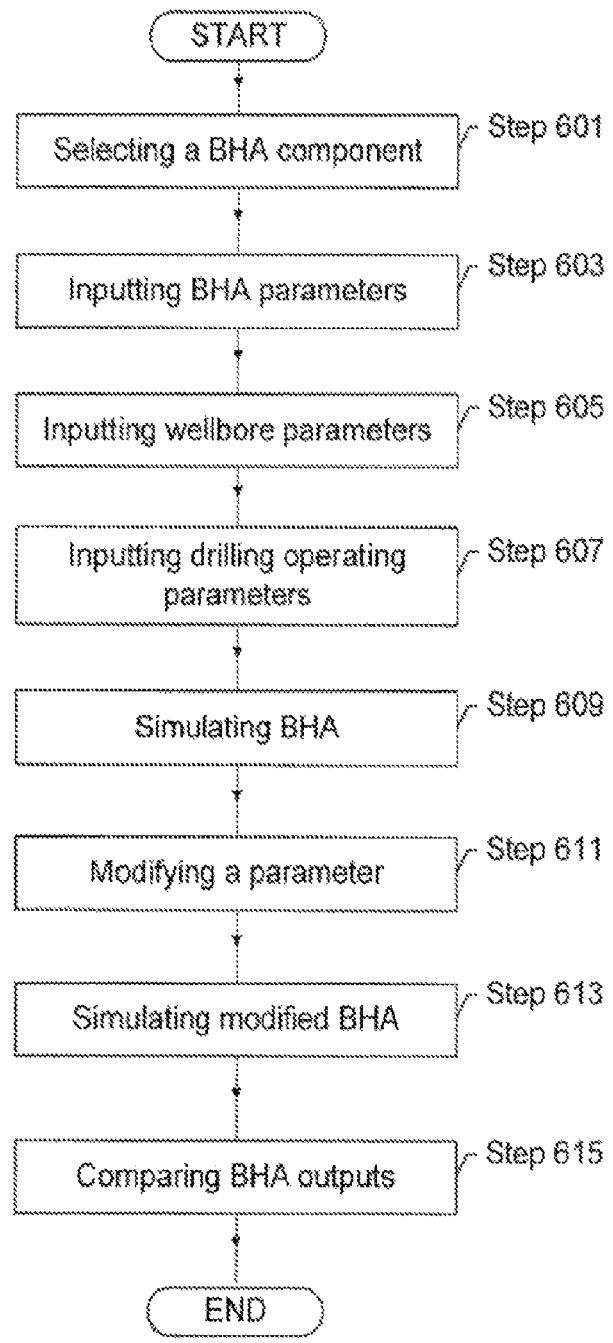
FIGS. 6A-6C show methods according to one or more embodiments of the present disclosure.

Referring now to FIG. 6A, a method according to one or more embodiments of the present disclosure is shown. In one or more embodiments, one or more of the steps shown in FIG. 6A may be omitted, repeated, and/or substituted. Accordingly, embodiments of selecting a BHA, designing a BHA, or planning a well should not be considered limited to the specific arrangements of modules shown in FIG. 6A.

As shown in FIG. 6A, a component of a BHA may be selected or input in 601. The component may be selected or input by an engineer using a GUI, such as GUI 512 in FIG. 5. The component may include any number of BHA components and may include drill string components such as pipes and/or collars, for example. After a BHA is selected or input, BHA parameters, wellbore parameters, and drilling operating parameters may be input in 603, 605, and 607, respectively. As described above, the parameters may be input using a GUI.

After the parameters are selected or input by an engineer, the BHA package is simulated in 609. The simulation dynamically simulates the BHA package based on the parameters input or selected by the engineer in 601, 603, 605, and 607. After simulation, a number of outputs are generated. The simulation may visualize the outputs on a GUI, such as GUI 512, as shown in FIG. 5. In one or more embodiments, a number of performance outputs are reviewed by an engineer. The performance outputs may be reviewed and the BHA designer may modify a parameter of the BHA package 611, or the designer may select another BHA package or component to be similarly simulated in 613. The outputs of one or more BHA packages may be compared in 615. As noted above, simulations may be performed simultaneously and their performances and corresponding borehole quality factors may be observed and compared as simulation progresses. This process may be repeated for any number of BHAs or parameters until an optimal BHA package for a given drilling application has been selected. The optimal (or improved) package may be determined based on the resulting quality of borehole that each BHA simulation outputs and/or the optimal (or improved) package may be determined based on a given criteria or threshold that may need to be satisfied for a particular oilfield operation.

Figure 6B:
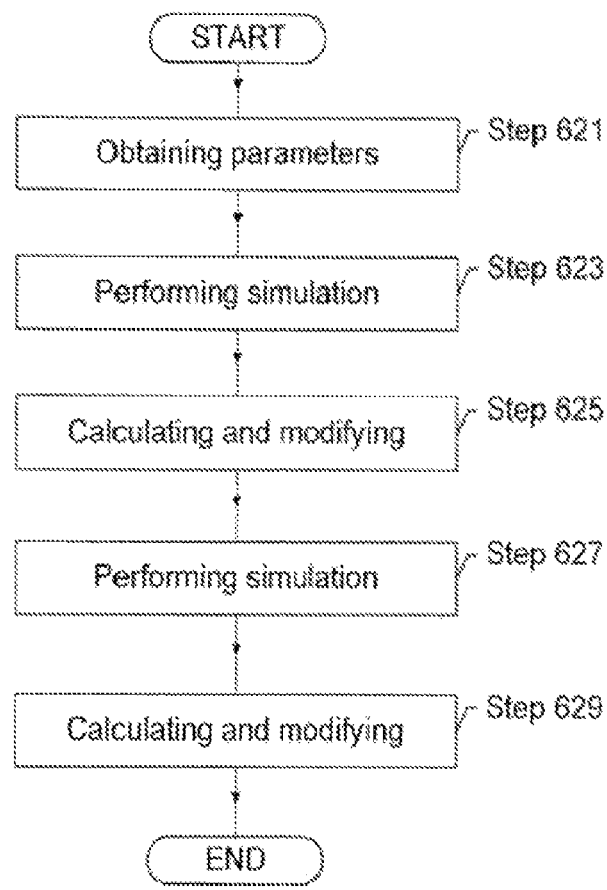

Referring now to FIG. 6B, a method according to one or more embodiments of the present disclosure is shown. In one or more embodiments, one or more of the steps shown in FIG. 6B may be omitted, repeated, and/or substituted. Accordingly, embodiments of selecting a BHA, designing a BHA, or planning a well should not be considered limited to the specific arrangements of modules shown in FIG. 6B.

As shown in FIG. 6B, a number of parameters may be obtained in 621. The parameters may include one or more of a plurality of BHA parameters, a plurality of wellbore parameters, a plurality of drilling operating parameters, or any other parameters described herein. In addition, the parameters obtained may correspond to a given field environment or a specific field operation. The parameters may be obtained/acquired prior to, during, or after a field operation is performed in a given field environment. In addition, the parameters may be selected or input by an engineer using a GUI, such as GUI 512 in FIG. 5.

After the parameters are selected or otherwise obtained in 621, a simulation may be performed in 623. The simulation dynamically simulates a BHA based on the parameters input and/or obtained in 621. After simulation, a number of outputs are calculated based on the simulation. Similar to the above, the simulation may visualize the outputs on a GUI, such as GUI 512, as shown in FIG. 5. In one or more embodiments, the one or more outputs may include one or more wellbore quality factors, such as those described above. The outputs may be reviewed and a well planning parameter may be modified in 625 (by a user, for example) based on the calculated output parameter from the simulation performed in 623.

Modification may involve changing the value of one or more well planning parameters based on a comparison of the output wellbore quality factor and a given criterion. For example, a user or engineer may desire a particular borehole size and shape, so as to utilize a particular device or operation after the borehole is drilled. If the output wellbore factor does not meet a particular threshold or criterion (e.g., the output borehole size is smaller than is desired by the engineer), the engineer may modify one or more well planning parameters (or any other parameter described here, for example, wellbore, BHA, and operating parameters), in order to obtain a modified parameter. Further, in one or more embodiments, the one or more parameters may be modified based on comparison of one or more output wellbore quality factors and an initial well plan. For example, a particular trajectory may be desired for a given drilling operation. If the output wellbore quality factor is not capable of the well trajectory of an initial well plan, one or more parameters may be modified in order to meet or satisfy the goals of a well plan. In some embodiments, should a modification to one or more parameters result in a more favorable well plan than that of the initial well plan, the initial well plan may be modified in order to account for such a result. Those of skill would know that one or more parameters may be modified in 625.

In one or more embodiments, using the modified parameter, another simulation may be performed in 627 based on the parameter modified in 625. Similarly, one or more wellbore quality factors may be calculated and output in 629 based on the modified parameter of 625. Thereafter, the one or more wellbore quality factors obtained in the first simulation may be compared to the one or more wellbore quality factors obtained in the second simulation. An engineer may then modify a well planning parameter based on the comparison of the first and second simulation outputs in order to achieve a better well quality, for example. As noted above, simulations may be performed simultaneously and their performances and corresponding borehole quality factors may be observed and compared as simulation progresses. This process may be repeated for any number of BHAs or parameters until an optimal (or improved) BHA package for a given drilling application has been selected, or until an optimal (or improved) well plan has been obtained. The optimal (or improved) package and/or well plan may be determined based on the resulting quality of borehole that each simulation outputs and/or the optimal package may be determined based on a given criteria or threshold that may need to be satisfied for a particular oilfield operation.

Figure 6C:
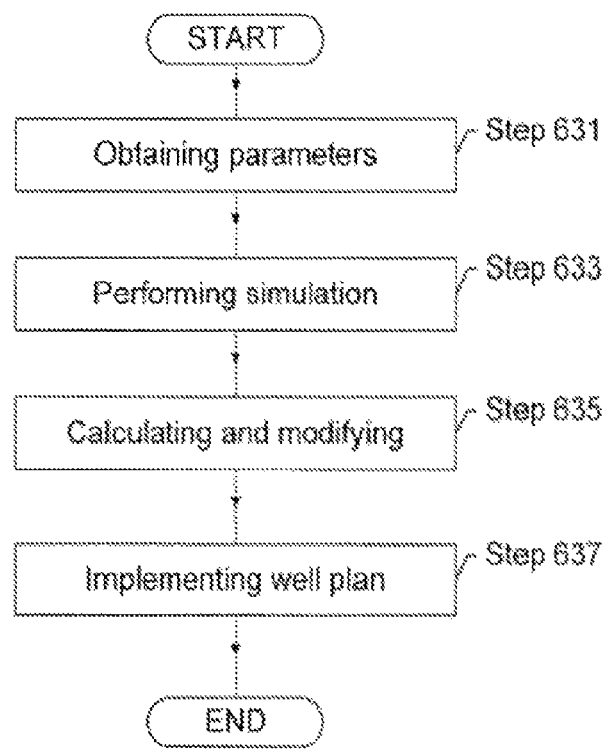

Referring now to FIG. 6C, a method according to one or more embodiments of the present disclosure is shown. In one or more embodiments, one or more of the steps shown in FIG. 6C may be omitted, repeated, and/or substituted. Accordingly, embodiments of selecting a BHA, designing a BHA, or planning a well should not be considered limited to the specific arrangements of modules shown in FIG. 6C.

As shown in FIG. 6C, a number of parameters may be obtained in 631. The parameters may include one or more of a plurality of BHA parameters, a plurality of wellbore parameters, a plurality of drilling operating parameters, or any other parameters described herein. In addition, the parameters obtained may correspond to a given field environment or a specific field operation. The parameters may be obtained/acquired prior to, during, or after a field operation is performed in a given field environment. In addition, the parameters may be selected or input by an engineer using a GUI, such as GUI 512 in FIG. 5.

After the parameters are selected or otherwise obtained in 631, a simulation may be performed in 633. The simulation dynamically simulates a BHA based on the parameters input and/or obtained in 631. After simulation, a number of outputs are calculated in 635 based on the simulation. Similar to the above, the simulation may visualize the outputs on a GUI, such as GUI 512, as shown in FIG. 5. In one or more embodiments, the one or more outputs may include one or more wellbore quality factors, such as those described above. The outputs may be reviewed and a well planning parameter may be modified in 635 (by a user, for example) based on the calculated output parameter from the simulation performed in 633.

Similar to the above, modification may involve changing the value of one or more well planning parameters based on a comparison of the output wellbore quality factor and a given criterion. For example, a user or engineer may desire a particular borehole size and shape, so as to utilize a particular device or operation after the borehole is drilled. If the output wellbore factor does not meet a particular threshold or criterion (e.g., the output borehole size is smaller than is desired by the engineer), the engineer may modify one or more well planning parameters (or any other parameter described here, for example, wellbore, BHA, and operating parameters), in order to obtain a modified parameter. Further, in one or more embodiments, the one or more parameters may be modified based on comparison of one or more output wellbore quality factors and an initial well plan. For example, a particular trajectory may be desired for a given drilling operation. If the output wellbore quality factor is not capable of the well trajectory of an initial well plan, one or more parameters may be modified in order to meet or satisfy the goals of a well plan.

In one or more embodiments, simulations may be performed simultaneously and their performances and corresponding borehole quality factors may be observed and compared as simulation progresses. Further, calculations of one or more wellbore quality factors may also occur in real time. Additionally, should a modification to one or more parameters result in a more favorable well plan than that of the initial well plan, the initial well plan may be modified in order to account for such a result. In some embodiments, a modified well plan may be implemented in 637 based on the real time wellbore quality factors calculating in 635. As such, after modification, it is determined that the modified well planning parameter better suits a particular oilfield operation or the goals set by an engineer, the modified well plan may be implemented, in real time, or at a later time, in order to optimally achieve a more favorable wellbore quality. This process may be repeated for any number of BHAs or parameters until an optimal BHA package for a given drilling application has been selected, or until an optimal well plan has been obtained. The optimal package and/or well plan may be determined based on the resulting quality of borehole that each simulation outputs and/or the optimal package may be determined based on a given criteria or threshold that may need to be satisfied for a particular oilfield operation.

Figure 7A:
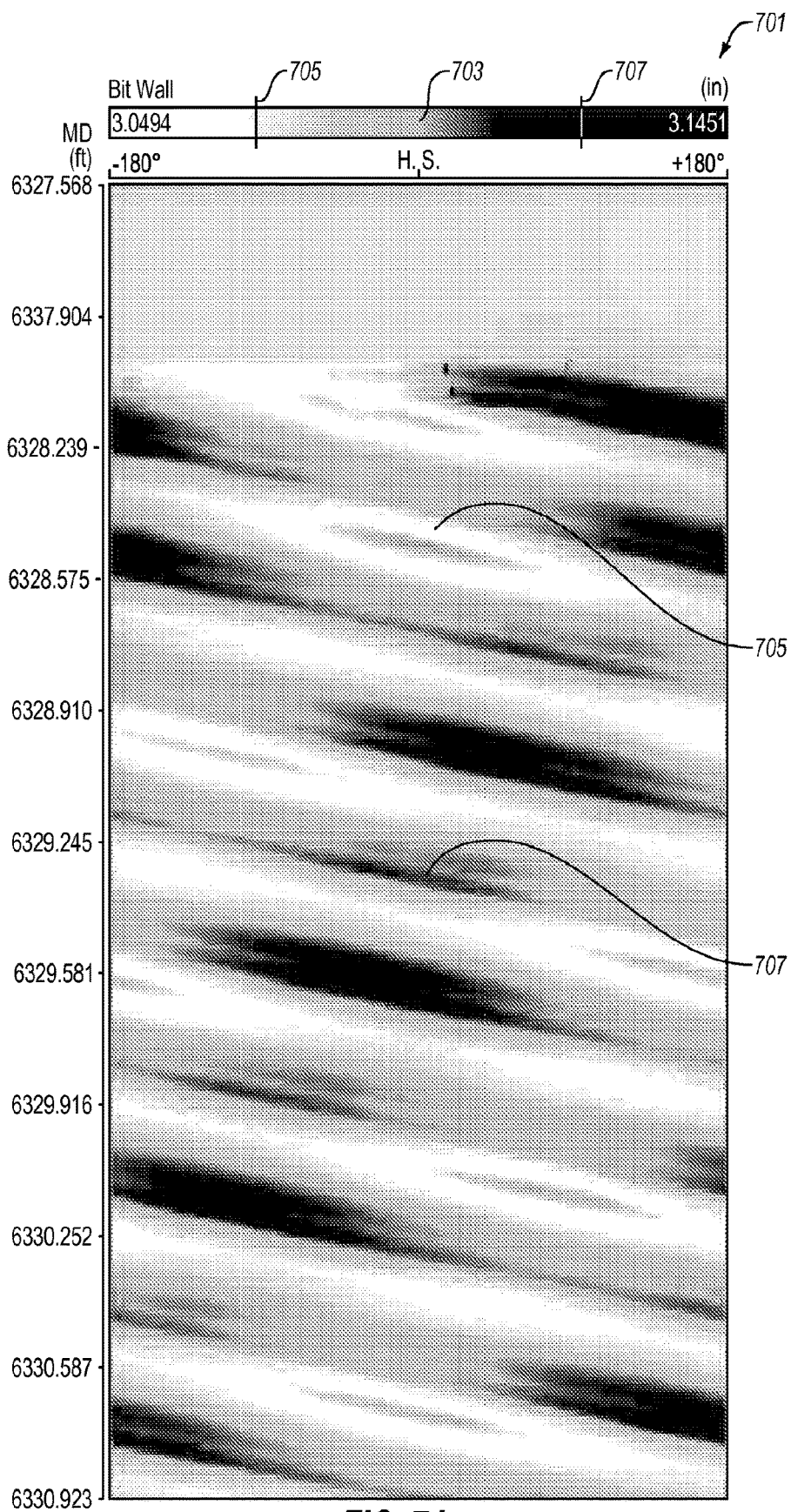
FIGS. 7A-7C shows examples of one or more outputs according to one or more embodiments of the present disclosure.
Figure 7B:
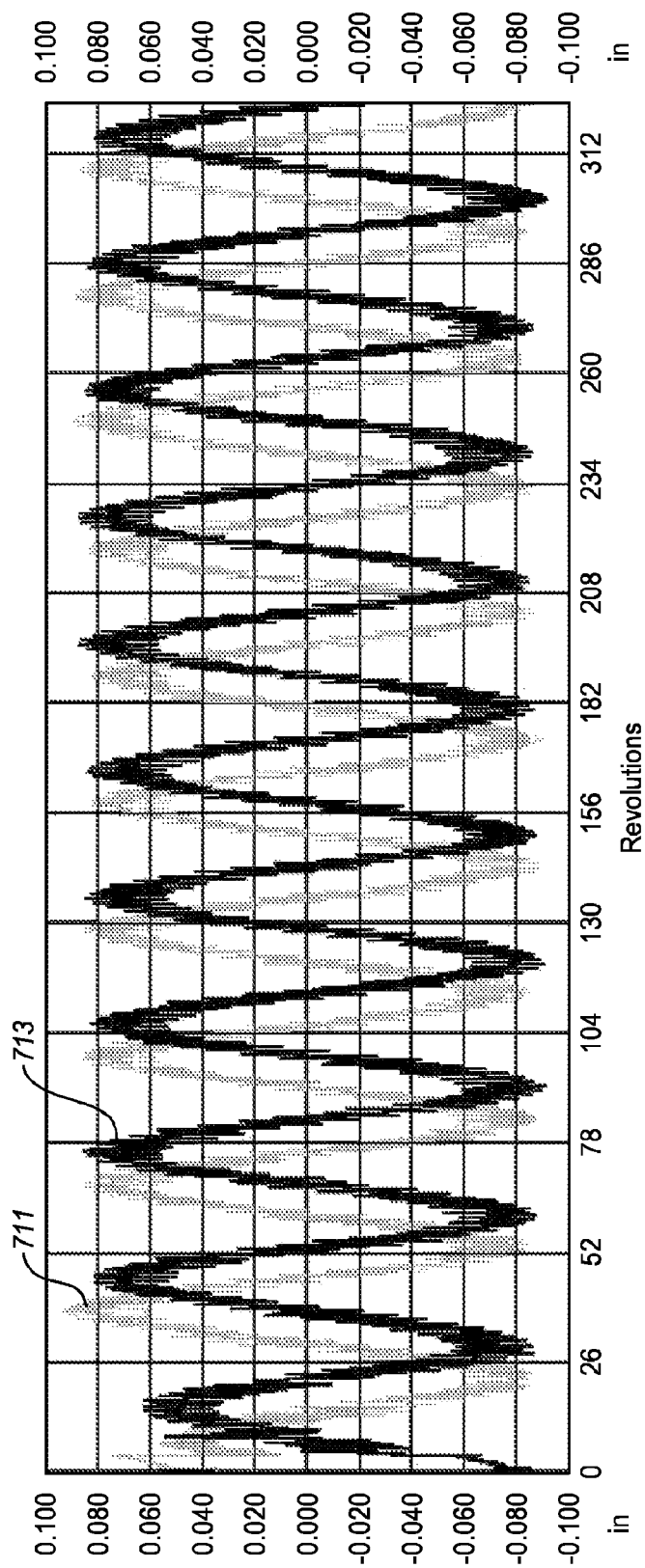
Figure 7C:
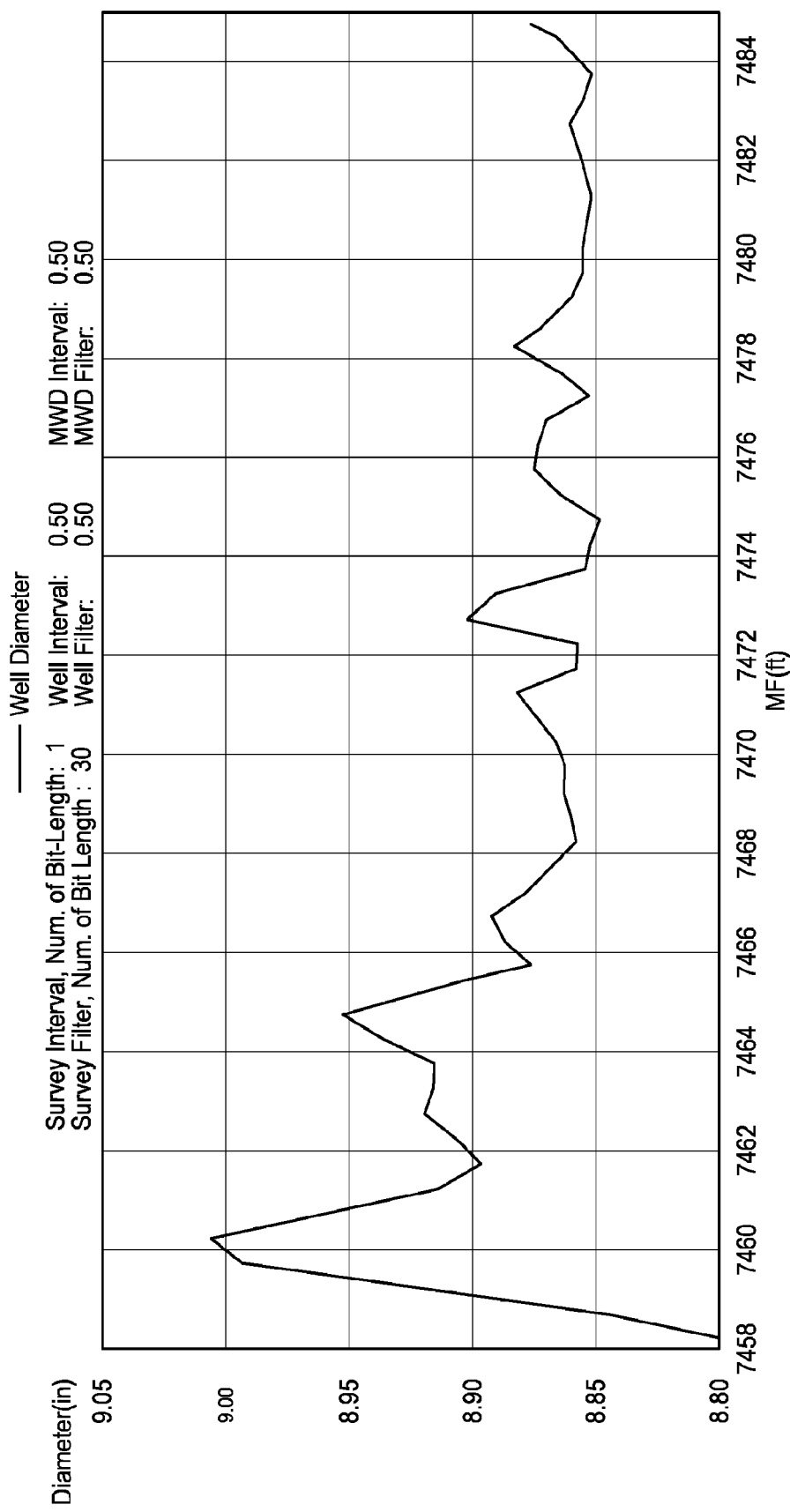

Referring now to FIGS. 7A-7C, examples of one or more simulation outputs according to the present disclosure is shown. In FIG. 7A, an example of a wall quality plot 701 is shown. The wall quality plot illustrates a distance of the borehole wall from the borehole centerline and is measured azimuthally, in degrees (x-axis), around the borehole (i.e., around the circumference of the borehole) with respect to measure depth (MD), in feet, of the borehole (y-axis). In addition, a color scale 703 is used to discriminate between different distances from center. As shown, as the depth of the well increases, spiraling, in particular short pitch spiraling, is observed as borehole wall distance from center repetitively varies from about 3.094 inches to about 3.1451 inches, as indicated by color scale 703. For clarification, colors 705 and 707 have been shown on the wall quality plot 701. Those having ordinary skill would know and appreciate that many different axes, scales, and units may be used to represent wall quality and the aforementioned example is for illustrative purposes only.

Turning to FIG. 7B, an example of bit movement is shown. In FIG. 7B, the center of the bit is plotted with respect to its current well axis. In this example, displacement of a single bit is plotted with respect to two different planes and is plotted as displacement, in inches, as a function of number of revolutions. As shown, bit displacement plot 711 and bit displacement plot 713 vary between about −0.08 inches and 0.08 inches. However, although the bit movement varies and almost varies repetitively, the bit displacement is not often an accurate representation of wellbore spiraling.

Referring now to FIG. 7C, an example of well diameter is shown. In FIG. 7C, the diameter, in inches, of a wellbore is plotted as a function of MD, in feet. This plot shows the change in borehole diameter as the bit drills.

As mentioned above, although the above examples represent simulation results over a period of time and/or distance, it should be noted that any simulated parameter may be observed in real time as simulation progresses and may also be used to compare different BHA packages or operating conditions against one another.

The following examples illustrate methods for selecting and designing a BHA for one or more drilling operations and the results obtained from one or more systems of the present disclosure according to one or more methods of the present disclosure. Those of skill in the art will appreciate that the following examples are for illustrative purposes only and should not limit the scope of the present disclosure.

Figure 8A:
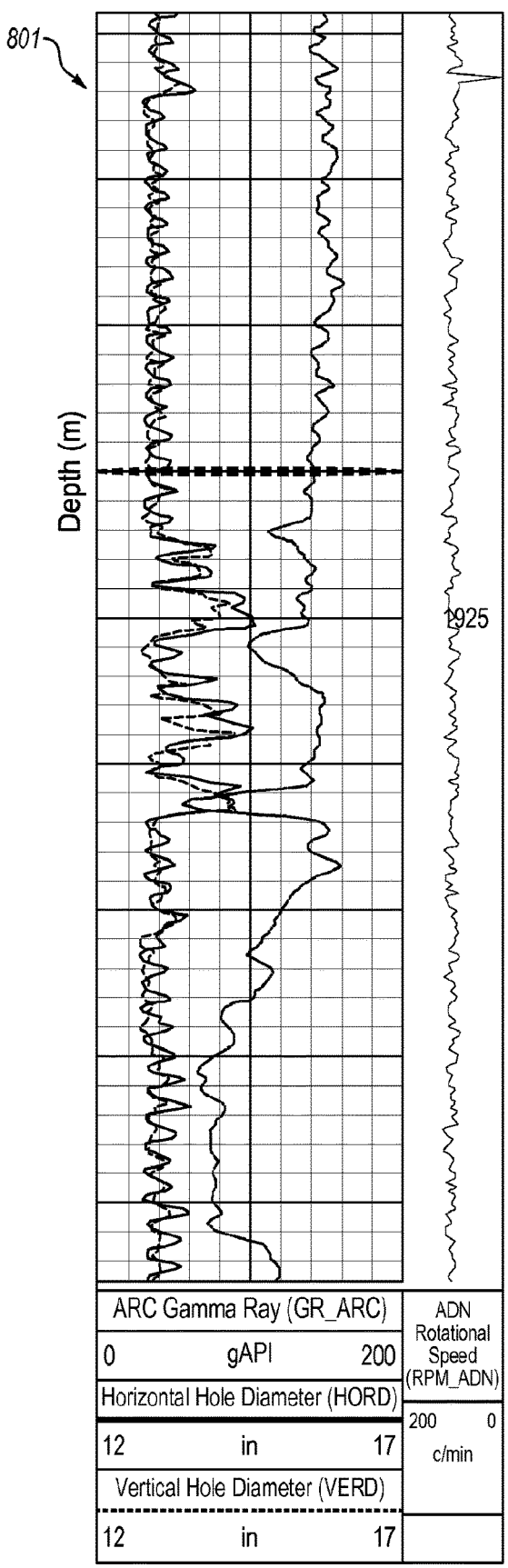
FIGS. 8A-8F show examples of field data and setups according to one or more embodiments of the present disclosure.
Figure 8B:
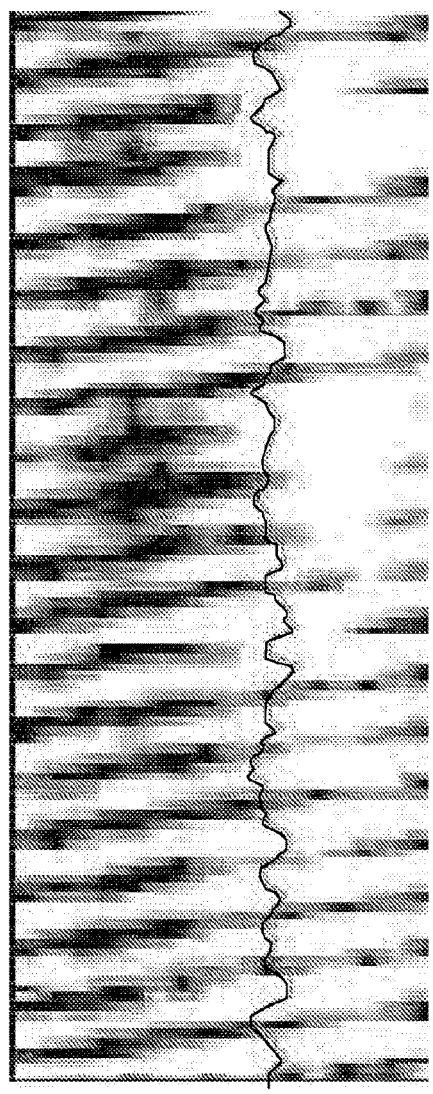
Figure 8C:
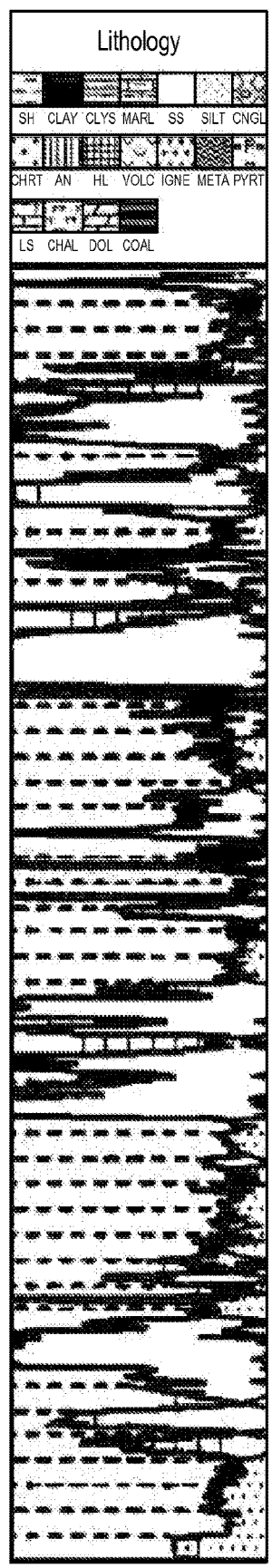

As mentioned above, one or more embodiments of the present disclosure allow for simulation of field data using given wellbore, operating, and drilling parameters where a number of BHAs may be simulated and analyzed. Referring now to FIGS. 8A-8F, an example of field data and a BHA setup is shown. In FIG. 8A, a caliper measurement obtained in the field is shown. The caliper measurement plot 801 may be used to plot a number of different measurements in a single graph as a function of borehole depth, in meters. In this example, horizontal and vertical hole diameters are plotted as a function of depth along with a gamma ray measurement and RPM. Additionally, as shown in FIG. 8B, a density log is shown indicating spiraling. A density log may be obtained from a LWD tool. For example, during drilling the LWD tool may measure the density of the substance around the tool. By derivation, the distance from the sensor to the hole wall may be measured and may reveal a borehole pattern (e.g., a spiraling pattern). Using the density log and caliper measurement, it is observed that the depth of the spiral is about 0.5 to 0.75 inches. In addition, referring to FIG. 8C, the lithology of the earth formation through which the borehole is drilled indicates both sand and shale lithology. However, as the spiraling observed is somewhat regular throughout the depth of the borehole, there is no obvious lithology effect.

Figure 8D:
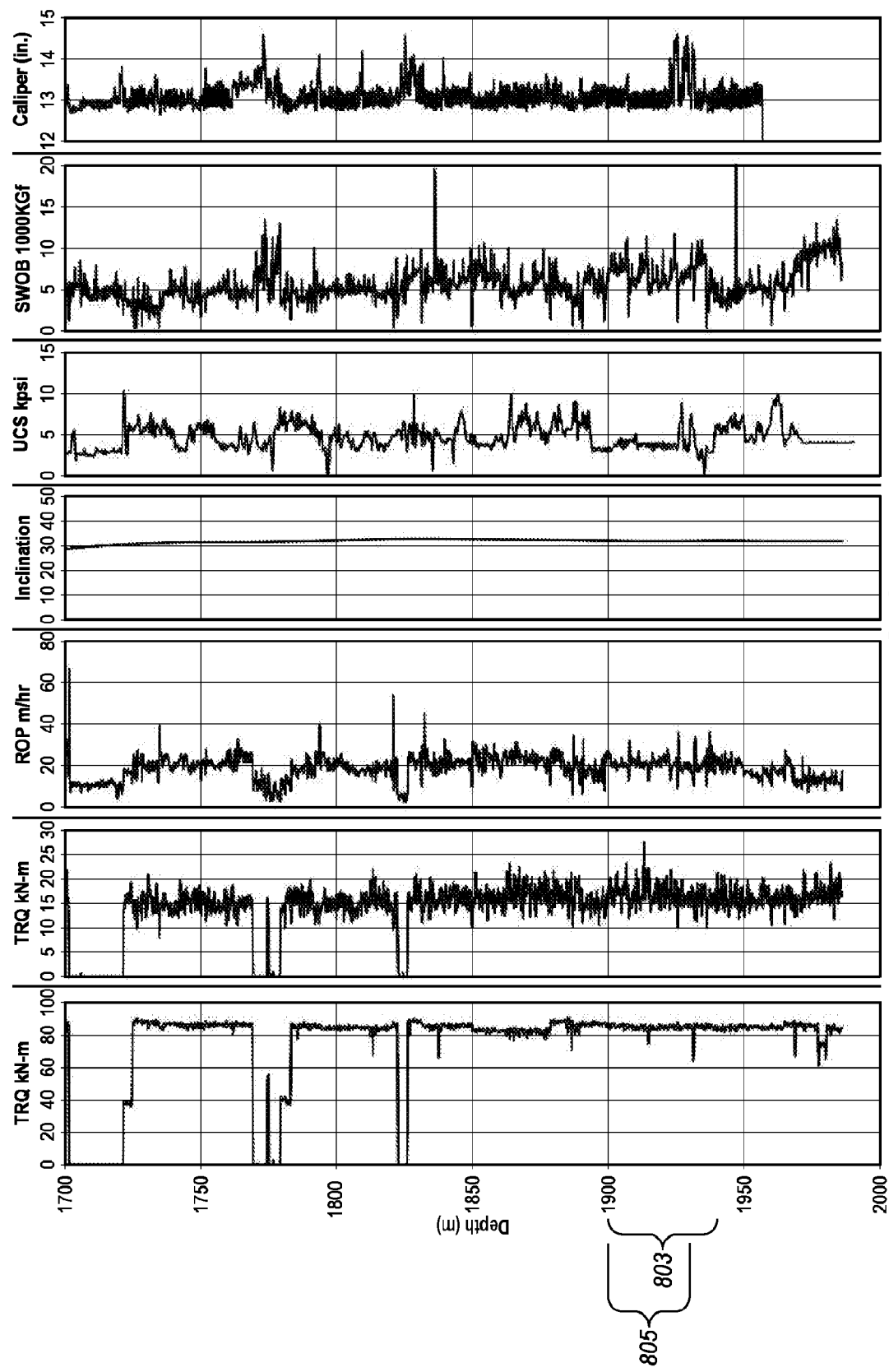

In order to simulate a BHA based on field data, field operating parameters such as RPM, torque, and ROP have been obtained and are illustrated in FIG. 8D. In FIG. 8D, a number of other operating parameters are shown as a function of depth and may be used in the simulation of a BHA. The caliper data shown in FIG. 8A is obtained in first depth range 803. In particular, the region associated with the spiraling as shown in FIG. 8A-8B, is observed beginning around a depth of 1900 m. For simulation setup, as will be discussed below, a second depth range 805 will be used.

Figure 8E:
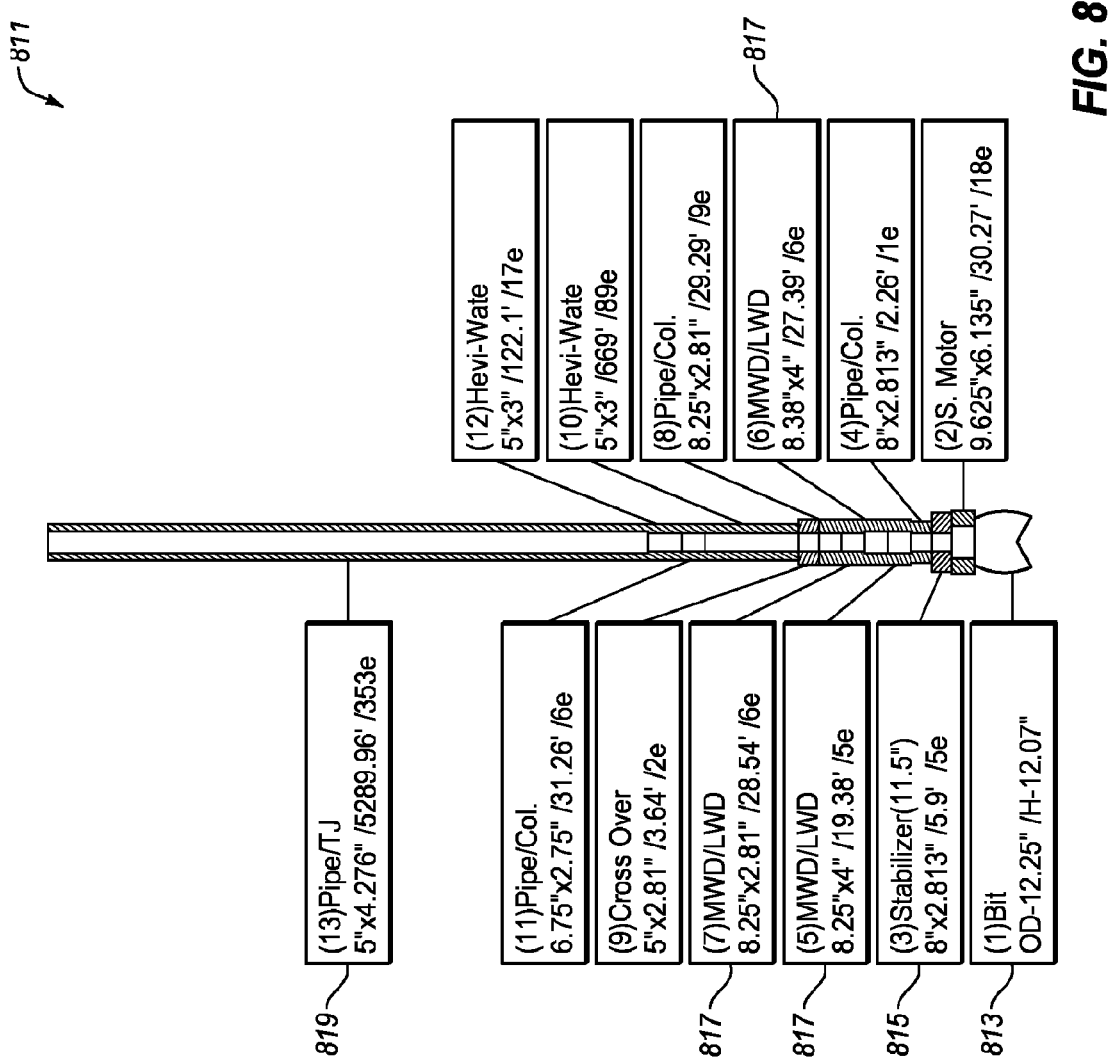

Referring to FIG. 8E, an example BHA 811 design is shown. The BHA 811 design has a number of components, such as drill pipes, stabilizers (stabs), drill bits, collars, subs, and other components known in the art. As understood by those of skill in the art, the BHA 811 is merely representative of the types of components that may be modeled, and no restriction on the scope of the disclosure is intended by reference to components that are or are not present.

In FIG. 8E, the components and corresponding dimensions of each component of the BHA 811 are shown. In one or more embodiments, a drill bit 813 having a number of cutting elements (not shown) is located at the bottom of the BHA 811. Moving up BHA 811 (towards the surface), BHA 811 includes a stabilizer (stab) 815, and a number of MWD/LWD apparatuses 817. Drill pipe is modeled at 819, for example. As shown, additional components of BHA 811 are also modeled. In addition, the details of each component are shown in table 821. Those having ordinary skill in the art will appreciate that these are merely representative of BHA components and that more or less components may be included in the model.

Figure 8F:
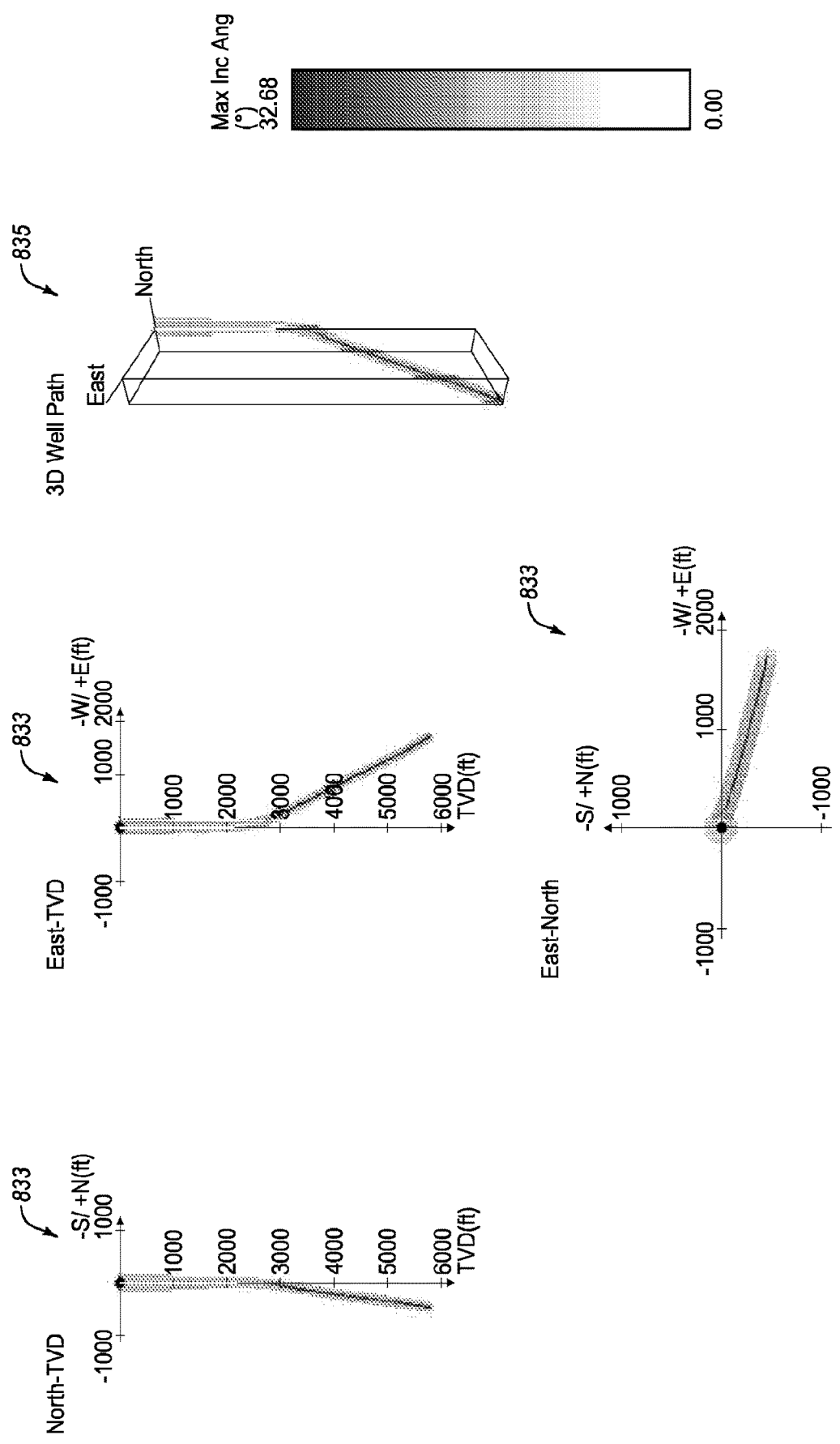

Referring to FIG. 8F, a well bore according to one or more embodiments of the present disclosure is shown. Similar to the drill string in FIG. 8E, the designer inputs or selects information about the well bore and produces an image showing various information. The designer may input information using a GUI, similar to that which is described above. In this example, the inclination angle 831, measured in degrees, of the well bore is modeled on graph 831 as a function of depth. In addition, the wellbore is also modeled as a function of cardinal direction in plots 833. As shown, the well bore may also be modeled in 3D as a function of depth having axes corresponding to the cardinal directions in plot 835.

Using simulation parameters, such as, but not limited to, the aforementioned wellbore and drilling operating parameters, a simulation may be performed to generate one or more performance outputs or wellbore quality outputs. Referring now to FIGS. 9A-9E, examples of simulation outputs according to one or more embodiments of the present disclosure are shown.

Figure 9A:
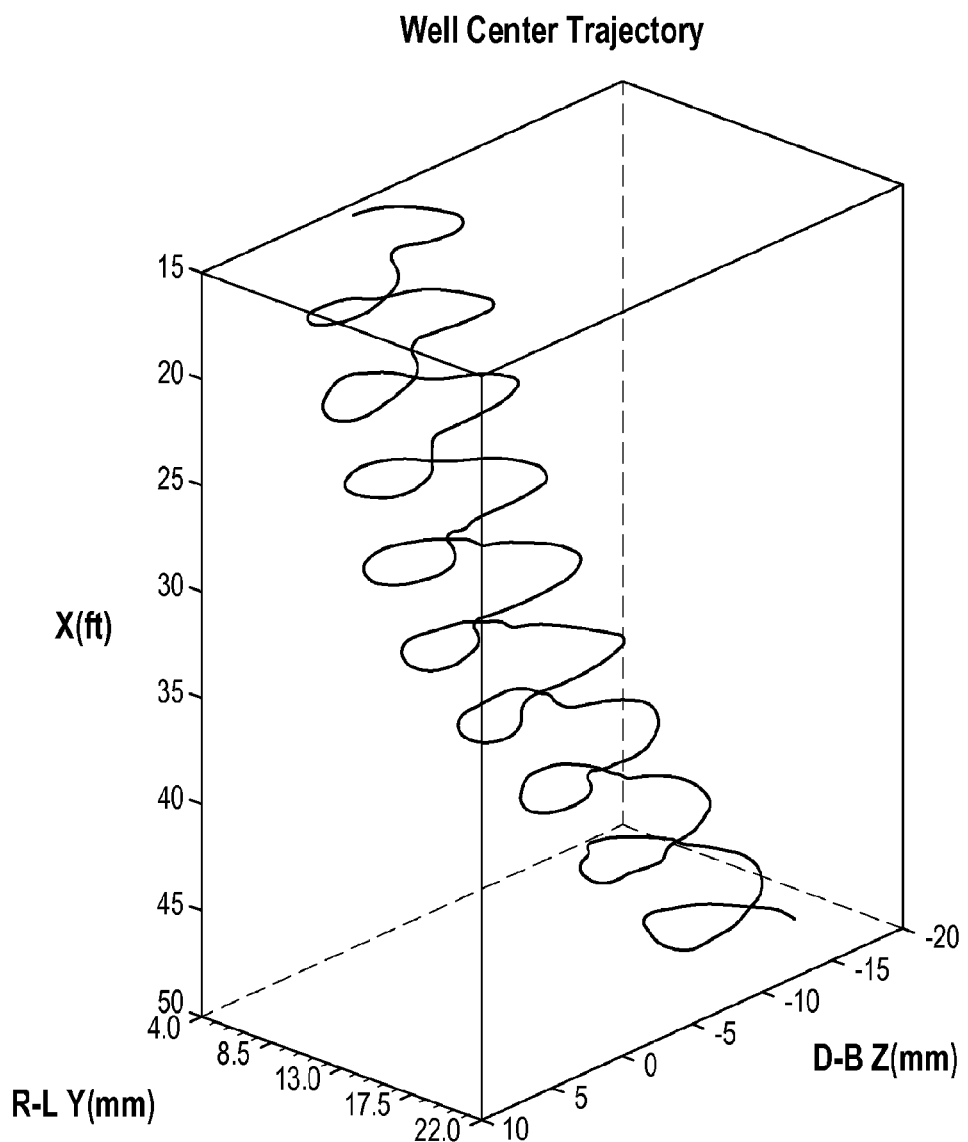
FIGS. 9A-9E show examples of graphs and plots according to one or more embodiments of the present disclosure.
Figure 9B:
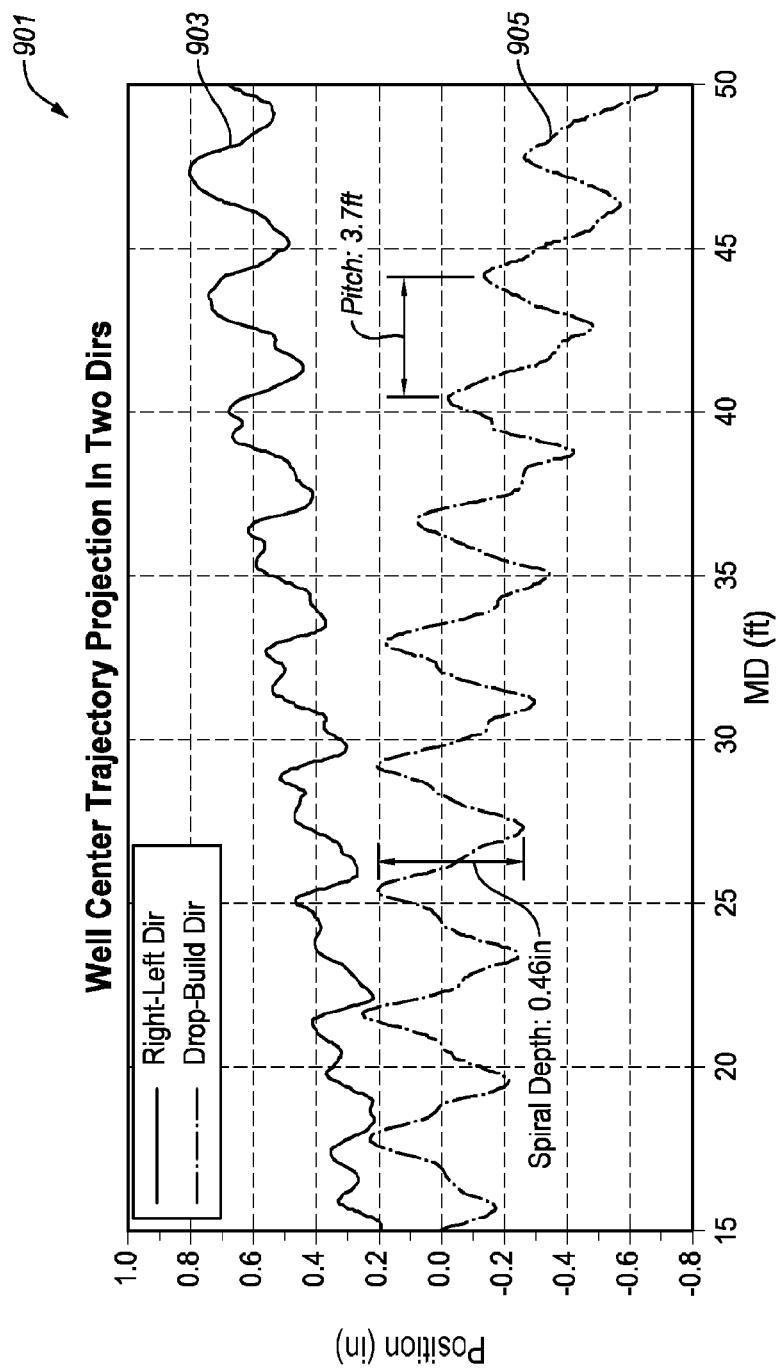
Figure 9C:
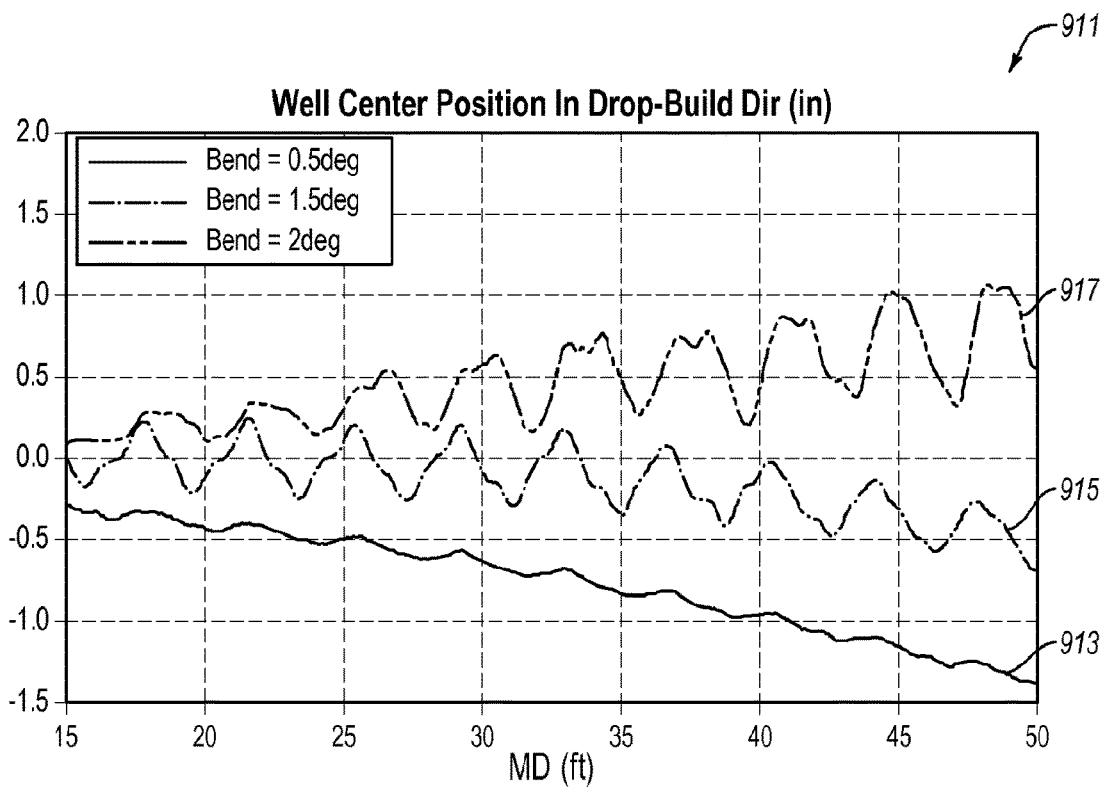
Figure 9D:
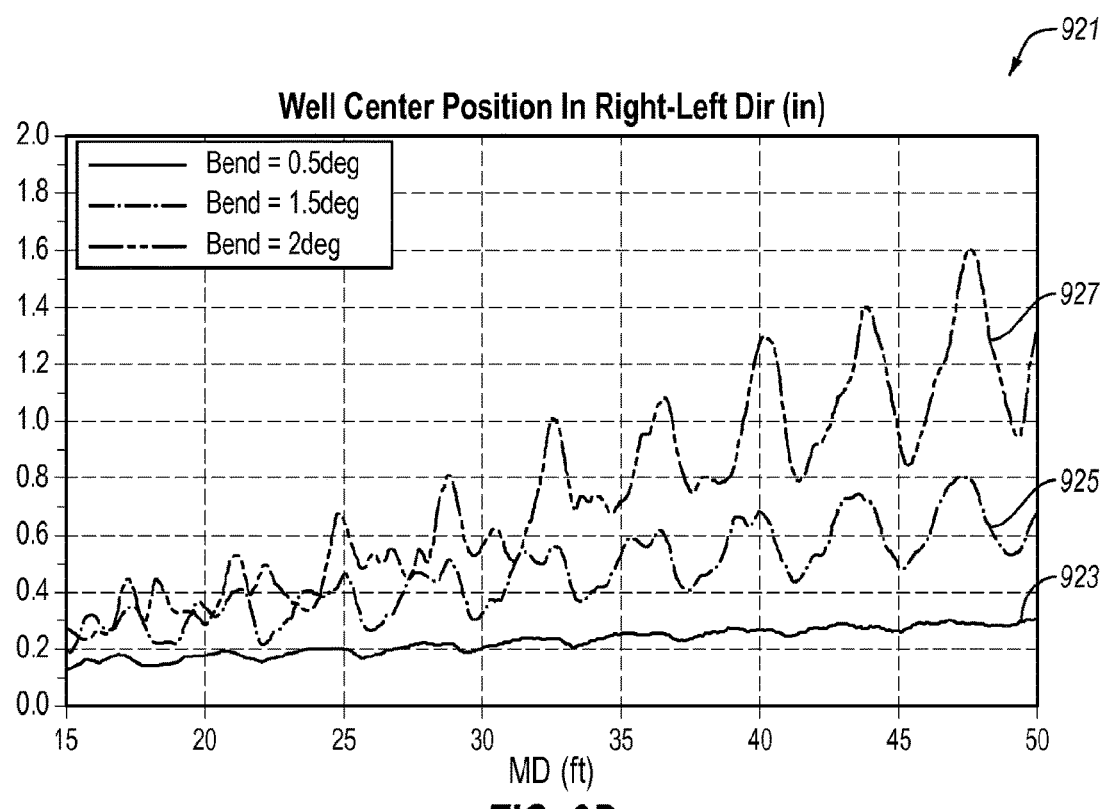

As shown in FIG. 9A, the well centerline trajectory is plotted in 3D. The measured distance in feet of the depth of the wellbore is along the vertical (x-axis), whereas the right-left (R-L) axis and drop-build (D-B) is measured in millimeters to illustrate spiraling result. In FIG. 9B, a graph 901 is used to show the well center trajectory in two directions. Specifically, as shown in FIG. 9B, the position or distance of the trajectory from center is plotted along the y-axis, in inches, and as a function of measured depth in feet along the x-axis. Plot 903 illustrates the right-left direction from center and plot 905 illustrates the drop-build direction from center. In this example, using 903 and 905, an approximation of the pitch and spiral depth may be calculated. In addition, a negative value in the drop-build direction indicates building, while a negative value in the right-left direction indicates walking to the right.

As noted above, a number of simulations may be run with different parameters to compare different drilling scenarios and results. For example, referring to FIGS. 9C-9D, graphs are shown to compare different bend angles during drilling. Graph 911 illustrates a drop-build position, in inches, as a function of MD, in feet, for three different bend angles that were simulated. Plots 913, 915, and 917, indicate bend angles of 0.5 degrees, 1.5 degrees, and 2 degrees, respectively. Similarly, graph 921 illustrates a right-left position, in inches, as a function of MD, in feet, for three different bend angles that were simulated. Plots 923, 925, and 927, indicate bend angles of 0.5 degrees, 1.5 degrees, and 2 degrees, respectively. From these examples, it appears that a greater bend angle increases the spiral amplitude but does not largely affect the pitch. In addition, the spiral is almost insignificant when bend angle is very low.

Figure 9E:
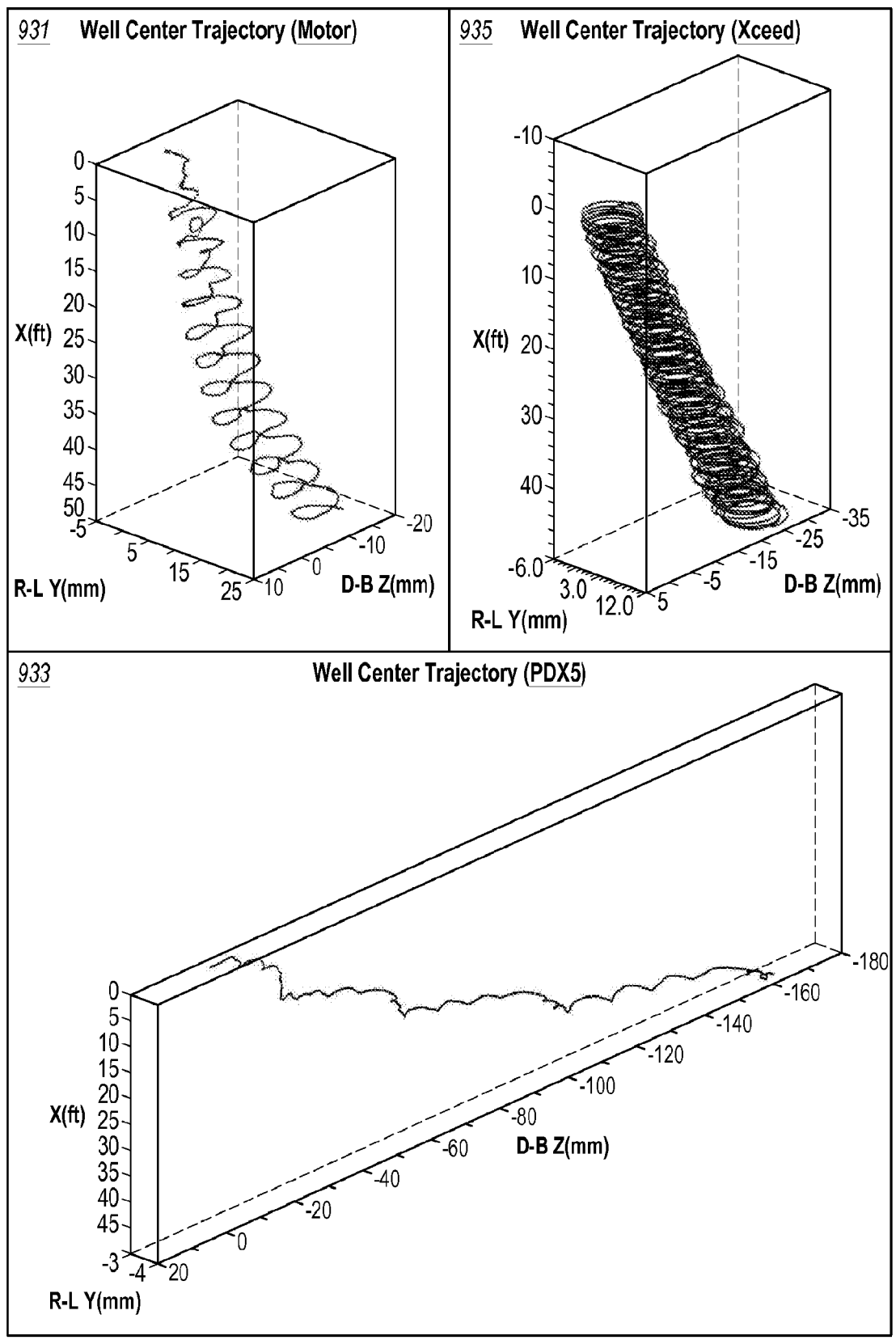

Referring to FIG. 9E, an example of well center trajectory for three simulated tools is shown. As discussed above, any number of components may be simulated to compare different components with particular drilling scenarios. In this example, the well center trajectory is plotted in 3D for three different direction tools. The center trajectory of a first drilling tool is shown in plot 931, while the center trajectory of the second and third simulated drilling tools are shown in plots 933 and 935, respectively. In plot 931, spiraling is observed as position changes in both the right-left and drop-build directions throughout the measured depth. In plot 933, it is observed that the drop-build direction drastically changes over depth whereas the right-left direction varies only slightly. Lastly, in plot 935, very short pitch spiraling is observed over depth.

Figure 10B:
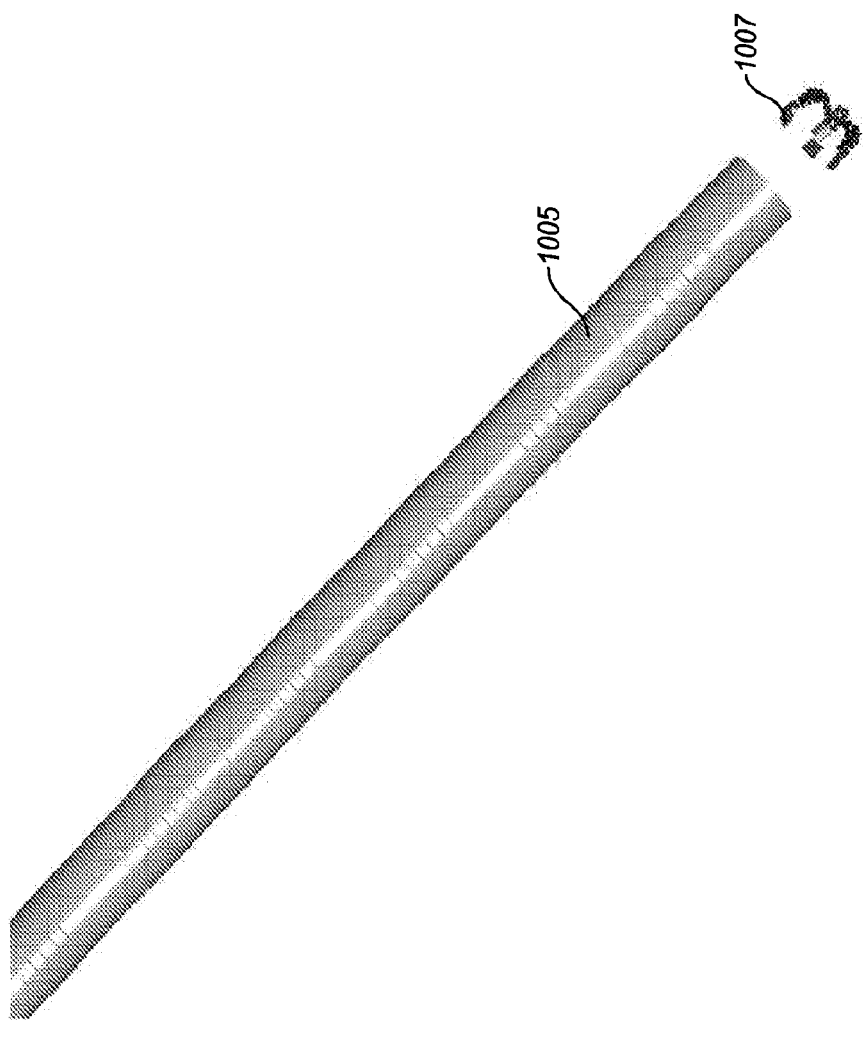
FIGS. 10A-10D depict a number of visualizations and plots according to one or more embodiments of the present disclosure.
Figure 10A:
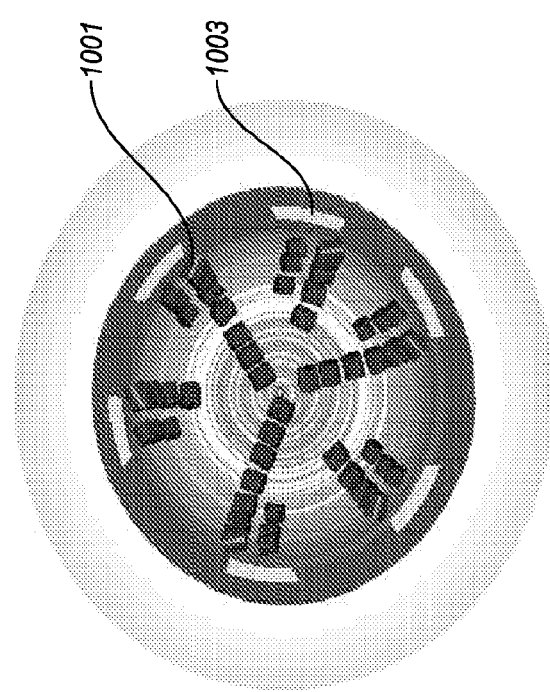

Referring now to FIGS. 10A-10D, a number of visualizations and plots are shown according to one or more embodiments of the present disclosure. In FIG. 10A, a cross-sectional visualization of a simulated borehole is shown looking through the borehole. As shown, a plurality of cutters 1001 is illustrated in a 3D rendering of a borehole 1003. Additionally, in FIG. 10B, a rendering of a surface of a borehole wall 1005 being drilled by drill bit 1007. The borehole wall 1005 and the borehole 1003 may be analyzed by an engineer to determine spiraling, ledging, or any other issue described herein or known in the art. After analysis, an engineer may design a new BHA or change one or more parameters in order to optimize the quality of the borehole.

Figure 10C:
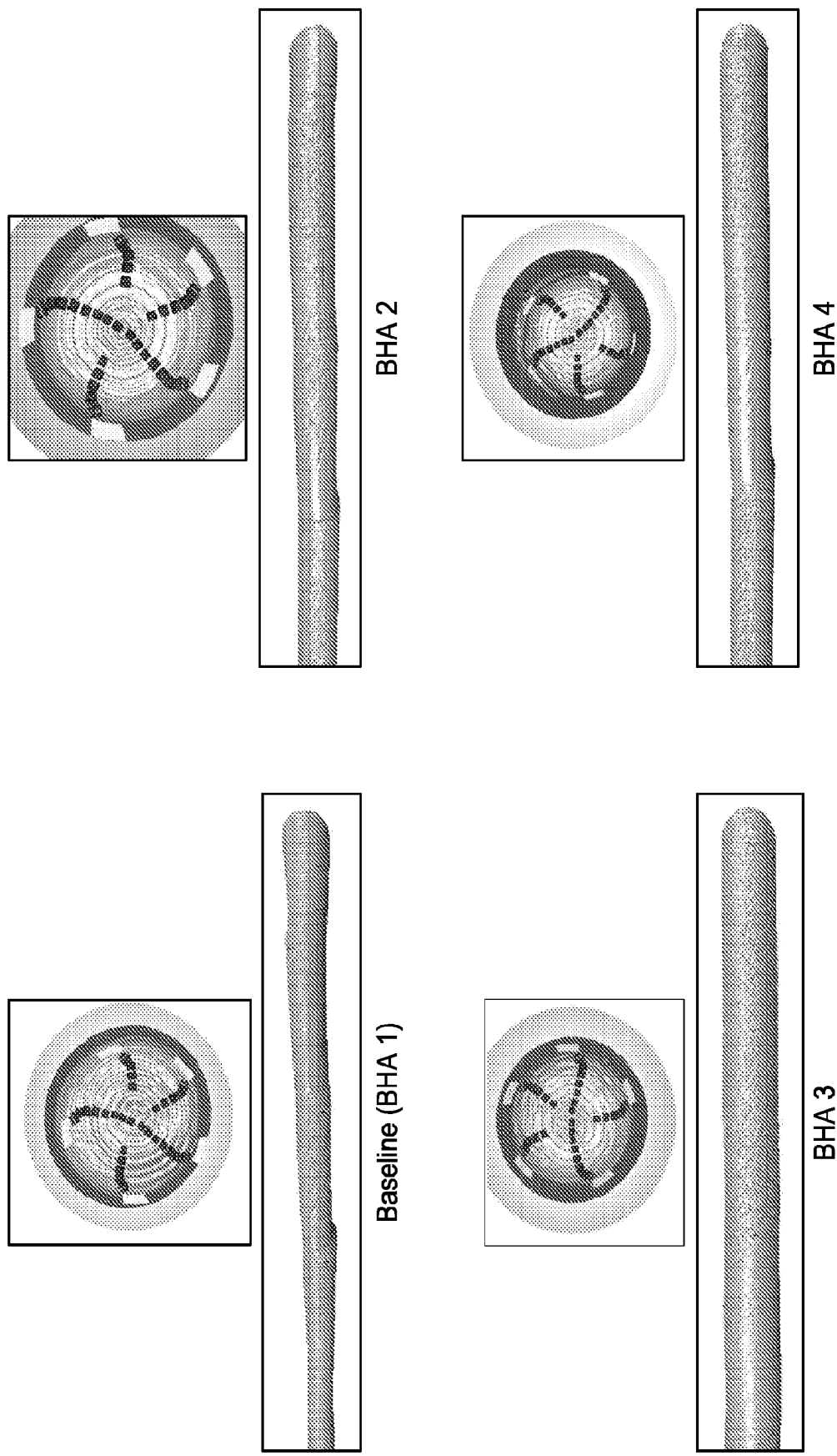

For example, as shown in FIG. 10C, four BHAs are simulated. In this example, the BHAs are simulated and may be observed in real-time, though only a snapshot of a segment of simulation is shown. Similar to FIGS. 10A-10B, the borehole surface and interior borehole wall may be simulated. Four BHAs are simulated and their corresponding through-hole rendering and borehole surface is shown.

Figures 1, 10D:
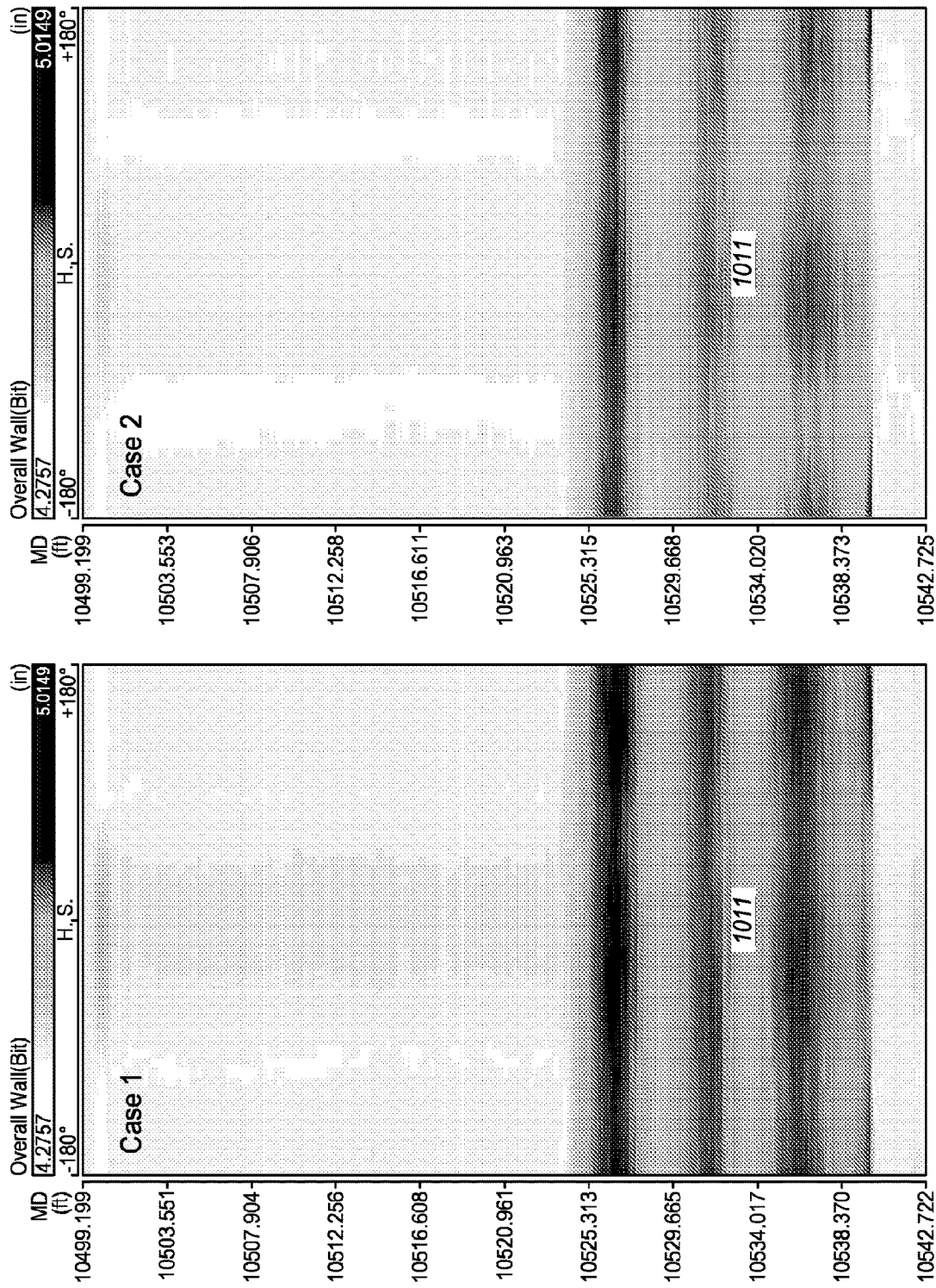
Figures 2, 10D:
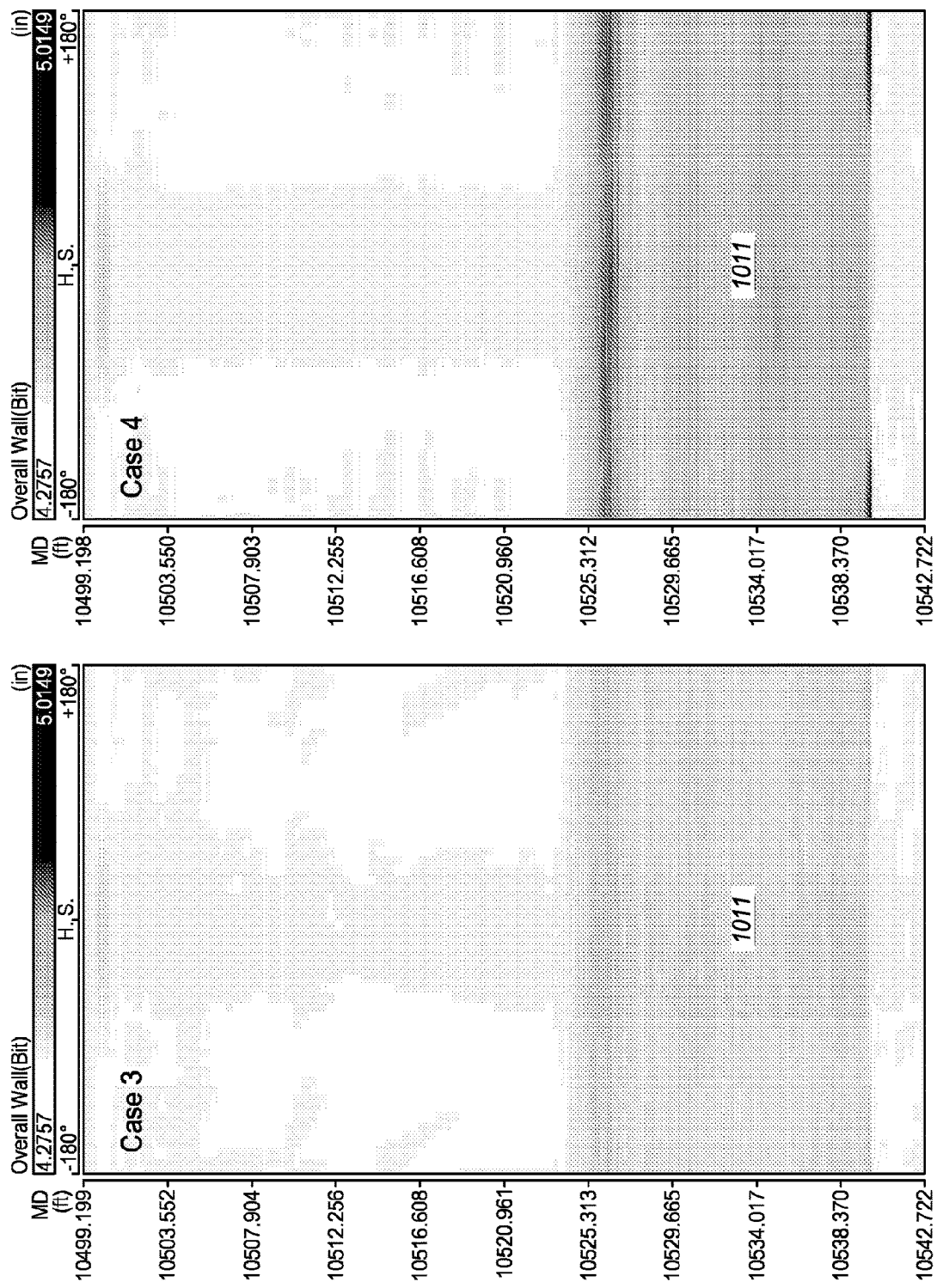
Figures 3, 10D:
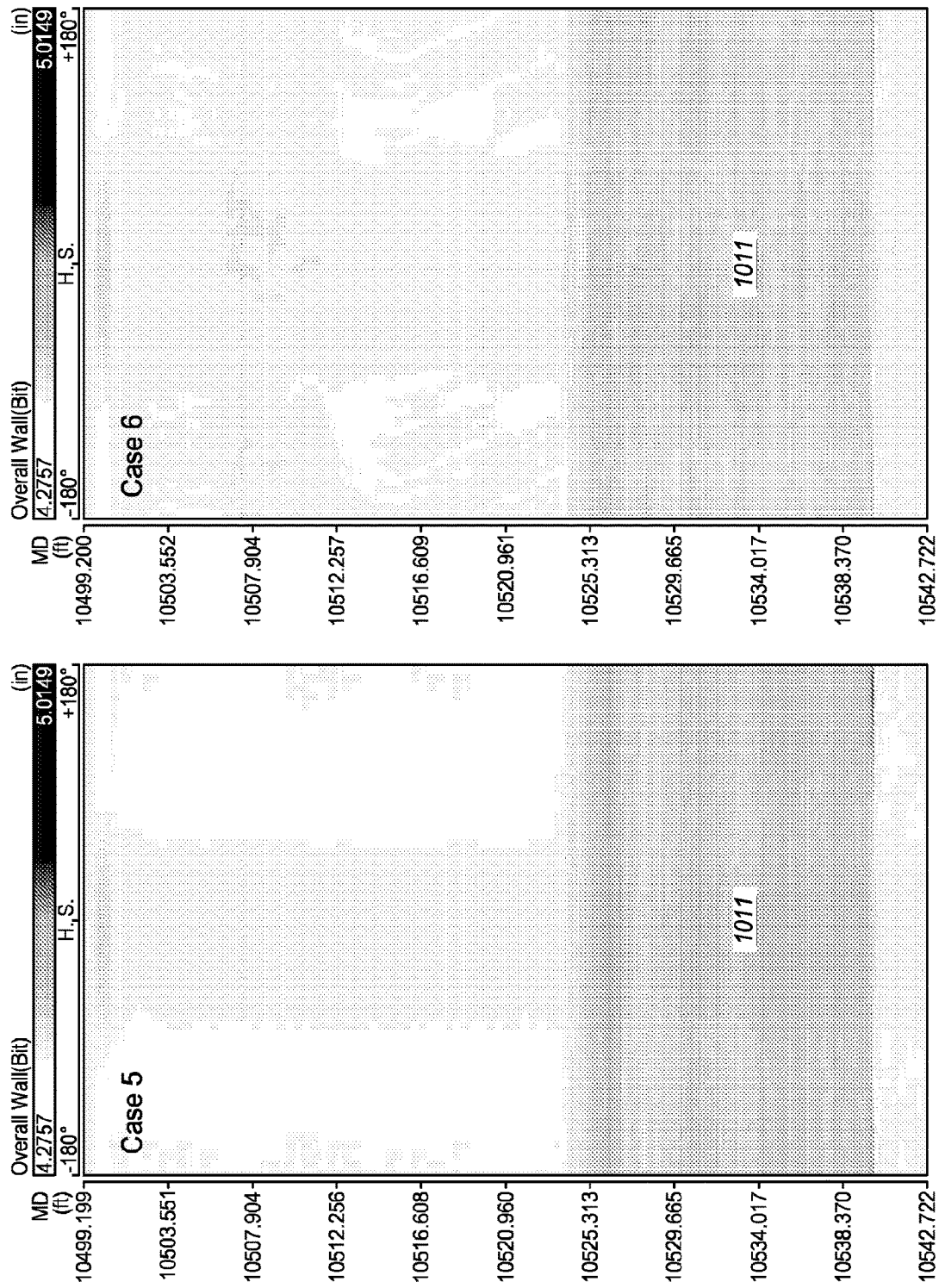

By analyzing each of the BHAs, an engineer may determine which BHA may satisfy a particular condition or may indicate a quality wellbore. Similarly, referring to FIG. 10D, a number of drilling scenarios may be simulated and output for comparison. In FIG. 10D, the wall quality of six scenarios is shown. In each of the scenarios, plots 1011 are the results from a rotating drilling mode, whereas the other portions of the plots are results from a sliding drilling mode. As shown, the rotating drilling mode 1011 results in a change in the wall quality when compared to a sliding drilling mode. Though no plot indicates high likelihood of spiraling, any number of drilling scenarios may be simulated and plotted for comparison.

Embodiments of the present disclosure, therefore, allow a BHA designer to compare and contrast performance characteristics of one or more BHAs under various wellbore conditions and drilling operation conditions. The BHA designer can then add, remove, or move components on the BHA to improve, modify, or remove deleterious effects. By allowing a designer to review well bore quality, the overall performance of the BHA in a particular field operation may be improved.

Further, advantageously, embodiments of the present disclosure allow for a drilling engineer, or BHA designer, to efficiently select or modify a BHA to be used for drilling by providing a method and system by which various BHAs can be simulated and their performance analyzed. The simulation results, models, and data for comparing one or more BHAs (either to one another, to specific criteria, or to one or more field tested BHAs) may help engineers determine an optimal or preferred BHA for use in drilling operations. Additionally, by analyzing various BHA parameters, a designer can select the optimal BHA for specific wellbore conditions and/or drilling operations based on one or more drilling performance parameters.

In addition, embodiments of the present disclosure allow engineers to analyze the quality of a drilled or to be drilled borehole. The quality of the borehole may improve ROP and lower vibrations, torque, and drag that may be experienced by a particular BHA package. In addition, a quality borehole may allow for more accurate data collection and efficient casing and or tripping or one or more downhole assemblies.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the disclosure. Further, portions of the systems and methods may be implemented as software, hardware, firmware, or combinations thereof.

Visual outputs that may be used according to the present disclosure, in addition to those shown and described herein, include any output shown or described in any of in U.S. Pat. Nos. 6,516,293, 6,873,947, 7,844,426, 7,139,689, 6,785, 641, 8,401,831, and 7,464,013 as well as U.S. patent application Ser. Nos. 10/749,019, 10/852,574, 10/851,677, 10/888,358, and 10/888,446, all of which are incorporated by reference in their entirety.

Although only a few example embodiments have been described in detail above, those skilled in the art will readily appreciate that many modifications are possible in the example embodiments without materially departing from this disclosure. Accordingly, all such modifications are intended to be included within the scope of this disclosure.

In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:

1. A method for selecting a bottomhole assembly (BHA), comprising:
    inputting BHA parameters, wellbore parameters, and drilling operating parameters;
    performing a dynamic simulation of a first BHA based on the BHA parameters, wellbore parameters, and drilling operating parameters;
    determining a first wellbore quality factor of a first simulated wellbore based on the dynamic simulation of the first BHA;
    presenting the first wellbore quality factor including preparing and presenting a wall quality plot illustrating a distance of a wellbore wall from a wellbore centerline; and
    selecting a BHA based on the first wellbore quality factor.

2. The method of claim 1, wherein the wellbore parameters comprise geometry of a well bore and formation material properties, trajectory of the well bore, friction of the well bore, and well bore fluid properties.

3. The method of claim 1, further comprising:
    modifying, based on the first wellbore quality factor, at least one parameter selected from the group consisting of the BHA parameter, the wellbore parameters, and the drilling operating parameters, wherein modifying involves changing a value of the at least one parameter to obtain a modified parameter;
    performing a dynamic simulation of a second BHA based on the modified parameter;
    presenting a second wellbore quality factor calculated from the dynamic simulation of the second BHA; and
    selecting a BHA based on the first and second wellbore quality factors.

4. The method of claim 3, wherein:
    the dynamic simulation of the first BHA comprises simulating the first BHA and visualizing the first wellbore quality factor in real time; and
    the dynamic simulation of the second BHA comprises simulating the second BHA and visualizing the second wellbore quality factor in real time.

5. The method of claim 1, wherein:
    inputting includes inputting a plurality of BHA parameters, a plurality of wellbore parameters, and a plurality of drilling operating parameters corresponding to a field environment;
    performing includes performing a dynamic simulation of the first BHA based on the plurality of BHA parameters, the plurality of wellbore parameters, and the plurality of drilling operating parameters;
    presenting includes presenting the first wellbore quality factor calculated from the dynamic simulation of the first BHA; and
    the method further includes:
        obtaining a plurality of field data; and
        comparing the first wellbore quality factor to the plurality of field data.

6. A non-transitory computer readable medium comprising executable instructions selecting a BHA, the executable instructions comprising functionality to perform the method of claim 1, wherein inputting and presenting are performed using a graphical user interface.

7. A system for planning a well, the system comprising:
    a computing device comprising a computing processor executing instructions to perform:
        executing a first simulation to generate a first wellbore quality factor of a distance from a wellbore wall from a borehole centerline of a simulated wellbore;
        modifying, based on the first wellbore quality factor, at least one parameter selected from the group consisting of a plurality of BHA parameters, a plurality of wellbore parameters, and a plurality of drilling parameters, wherein modifying involves changing a value of the at least one parameter to obtain a modified parameter;
        executing a second simulation based on the modified parameter to generate a second wellbore quality factor;
        comparing the first wellbore quality factor to the second wellbore quality factor;
        modifying a well planning parameter based on the comparison of the first wellbore quality factor to the second wellbore quality factor; and
        selecting a BHA based on the comparison of the first wellbore quality factor to the second wellbore quality factor.

8. The system of claim 7, wherein modifying the well planning parameter comprises changing a value of the well planning parameter to achieve better well quality, and wherein the well planning parameter comprises at least one selected from the group consisting of wellbore trajectory, wellbore shape, direction of drilling, wellbore total depth, completion depth, a number and depth of a sidetracked borehole, and location to begin drilling a completion process of the well.

9. The system of claim 7, modifying the well planning parameter comprises changing a value of a drilling procedure to achieve better well quality, and wherein the drilling procedure comprises at least one selected from the group consisting of motor rotating sequence, motor sliding sequence, motor rotating time, and motor sliding time.

10. A method for planning a well, the method comprising:
    obtaining a plurality of BHA parameters, a plurality of wellbore parameters, and a plurality of drilling operating parameters corresponding to a field environment;
    performing a simulation based on the plurality of BHA parameters, the plurality of wellbore parameters, and the plurality of drilling operating parameters, the simulation including simulating a borehole surface and determining a distance between a borehole wall and a centerline of the borehole;
    calculating a first wellbore quality factor from the simulation;
    modifying a well planning parameter based on the first wellbore quality factor; and
    selecting a BHA based on the first wellbore quality factor.

11. The method of claim 10, wherein modifying involves changing a value of the well planning parameter based on a comparison of the first wellbore quality factor to a given criterion.

12. The method of claim 10, wherein modifying involves changing a value of the well planning parameter based on a comparison of the first wellbore quality factor to a wellbore quality factor of an initial well plan.

13. The method of claim 10, wherein performing the simulation and calculating the first wellbore quality factor occur in real time.

14. The method of claim 10, further comprising:
implementing the modified well plan based on the modified well planning parameter.

15. The method of claim 10, further comprising:
performing a second simulation based on the modified well planning parameter;
calculating a second wellbore quality factor from the second simulation; and
modifying a well planning parameter based on a comparison of the first wellbore quality factor and the second wellbore quality factor.

16. The method of claim 10, wherein modifying the well planning parameter comprises changing a value of the well planning parameter to achieve better well quality, and wherein the well planning parameter comprises at least one selected from the group consisting of wellbore trajectory, wellbore shape, direction of drilling, wellbore total depth, completion depth, a number and depth of a sidetracked borehole, and location to begin drilling a completion process of the well.

17. The method of claim 10, modifying the well planning parameter comprises changing a value of a drilling procedure to achieve better well quality, and wherein the drilling procedure comprises at least one selected from the group consisting of motor rotating sequence, motor sliding sequence, motor rotating time, and motor sliding time.

18. The system of claim 7, wherein:
the computing device comprises computing processor executing instructions to execute a second simulation to generate a second wellbore quality factor; and
the computing device further comprises a graphical user interface executing on the computer processor with functionality to perform:
inputting the plurality of BHA parameters, the plurality of wellbore parameters, and the plurality of drilling parameters;
presenting, on the graphical user interface, the first wellbore quality factor from the first simulation, the first simulation based on the plurality of BHA parameters, the plurality of wellbore parameters, and the plurality of drilling parameters;
performing the modifying, based on the first wellbore quality factor, of the at least one parameter;
presenting, on the graphical user interface, the second wellbore quality factor from the second simulation, the second simulation based on the modified parameter; and
selecting a BHA based on the first and the second wellbore quality factors.

19. The system of claim 18, wherein at least one of the first wellbore quality factor or the second wellbore quality factor comprises at least one selected from the group consisting roundness, wall quality, effective diameter, tortuosity, spiraling, or ledging.

* * * * *